(12) United States Patent
Murphy et al.

(10) Patent No.: US 9,059,796 B2
(45) Date of Patent: *Jun. 16, 2015

(54) WIDEBAND RECEIVER ROBUST TO RADIO FREQUENCY HARMONICS

(71) Applicant: Broadcom Corporation, Irvine, CA (US)

(72) Inventors: David Murphy, Costa Mesa, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 255 days.

This patent is subject to a terminal disclaimer.

(21) Appl. No.: 13/736,895

(22) Filed: Jan. 8, 2013

(65) Prior Publication Data
US 2014/0171006 A1 Jun. 19, 2014

Related U.S. Application Data

(60) Provisional application No. 61/737,077, filed on Dec. 13, 2012.

(51) Int. Cl.
*H04B 1/10* (2006.01)
*H04B 15/06* (2006.01)

(52) U.S. Cl.
CPC .................................... *H04B 15/06* (2013.01)

(58) Field of Classification Search
CPC ...... H03D 3/06; H03D 7/18; H03F 2200/294; H03F 3/45188; H03G 1/0029; H04B 1/30; H04B 1/10
USPC ................................................ 455/295, 296
See application file for complete search history.

(56) References Cited

U.S. PATENT DOCUMENTS

| 8,670,739 | B1 * | 3/2014 | Murphy et al. | 455/307 |
| 2005/0239430 | A1 * | 10/2005 | Shah | 455/326 |
| 2013/0059556 | A1 * | 3/2013 | Molnar et al. | 455/234.1 |

OTHER PUBLICATIONS

Andrews, et al., "A Passive-Mixer-First Receiver with Baseband-Controlled RF Impedance Matching, < 6dB NF, and > 27 dBm Wideband IIP3," 2010 IEEE International Solid State Circuits Conference, Session 2, mm-Wave Beamforming & RF Building Blocks, 2.5, pp. 46-48.

(Continued)

*Primary Examiner* — Christian Hannon
(74) *Attorney, Agent, or Firm* — McDermott Will & Emery LLP

(57) ABSTRACT

A radio frequency (RF) noise-cancelling receiver includes first transconductance cells configured to produce respective weighted current signals proportional to an input voltage signal. The RF receiver includes frequency conversion cells coupled to the first transconductance cells and configured to mix the weighted current signals with a plurality of non-overlapping local oscillator (LO) signals to produce downconverted current signals. The RF receiver includes transimpedance amplifiers coupled to the frequency conversion cells and configured to produce output voltage signals proportional to the downconverted current signals. The transimpedance amplifiers include second transconductance cells. Each of the first and second transconductance cells has an effective transconductance of a first magnitude for frequency components of the input voltage signal arising from a first harmonic and an effective transconductance of a second magnitude less than the first magnitude for frequency components of the input voltage signal arising from harmonics at integer multiples of the first harmonic.

20 Claims, 18 Drawing Sheets

(56) References Cited

OTHER PUBLICATIONS

Andrews, et al., "Implications of Passive Mixer Transparency for Impedance Matching and Noise Figure in Passive Mixer-First Receivers," IEEE Transactions on Circuits and Systems—I: Regular Papers, Dec. 2010, vol. 57, No. 12, pp. 3092-3103.

Andrews, et al., "A Passive Mixer-First receiver with Digitally Controlled and Widely Tunable RF Interface," IEEE Journal of Solid State Circuits, Dec. 2010, vol. 45, No. 12, pp. 2696-2708.

Borremans, et al., "A 40nm CMOS Highly Linear 0.4-to-6GHz Receiver Resilient to 0dBm Out-of-Band Blockers," 2011 IEEE International Solid State Circuits Conference, Session 3, RF Techniques, 3.6, pp. 62-64.

Borremans, et al., "A 40nm CMOS Highly Linear 0.4-to-6GHz Receiver Resilient to 0dBm Out-of-Band Blockers," IEEE Journal of Solid State Circuits, Jul. 2011, vol. 46, No. 7, pp. 1659-1671.

Ru, et al., "A Software Defined Radio Receiver Architecture Robust to Out-of-Band Interface," 2009 IEEE International Solid State Circuits Conference, Session 12, RF Building Blocks, 12.8, pp. 230-233.

Ru, et al., "Digitally Enhanced Software Defined Radio Receiver Robust to Out-of-Band Interference," IEEE Journal of Solid State Circuits, Dec. 2009, vol. 44, No. 12, pp. 3359-3375.

Ru, "Frequency Translation Techniques for Interference-Robust Software-Defined Radio Receivers," Doctoral Thesis, Nov. 2009, 222 pages (Uploaded in two parts due to size).

Soer, et al., "A 0.2-to-2.0GHxz CMOS Receiver without LNA Achieving >11dBm IIP3 and <6.5 dB NF," 2009 IEEE International Solid State Circuits Conference, Session 12, RF Building Blocks, 12.4, pp. 222-224.

Franks, et al., "An Alternative Approach to the Realization of Network Transfer Functions: The N-Path Filter," The Bell System Technical Journal, Sep. 1960, pp. 1321-1350.

Von Grunigen, et al., "An Integrated CMOS Switched-Capacitor Bandpass Filter based on N-Path and Frequency-Sampling Principles," IEEE Journal of Solid State Circuits, Dec. 1983, vol. SC-18, No. 6, pp. 753-761.

Sacchi, et al., "A 15 mW, 70 kHz 1/f Corner Direct Conversion CMOS Receiver," 2003 IEEE Custom Integrated Circuits Conference, pp. 459-462.

Lu, et al., "A SAW-less GSM/GPRS/EDGE Receiver Embedded in a 65nm CMOS SoC," 2011 IEEE International Solid State Circuits Conference, Session 21, Cellular, 21.1, pp. 364-366.

Yu, et al., "A SAW-less GSM/GPRS/EDGE Receiver Embedded in a 65nm CMOS SoC," IEEE Journal of Solid-State Circuits, Dec. 2011, vol. 46, No. 12, pp. 3047-3060.

\* cited by examiner

WIDEBAND RECEIVER ROBUST TO RADIO FREQUENCY HARMONICS

CROSS-REFERENCE TO RELATED APPLICATIONS

This application claims the benefit of U.S. Provisional Application No. 61/737,077, entitled "WIDEBAND RECEIVER ROBUST TO RADIO FREQUENCY AND BASEBAND HARMONICS," filed Dec. 13, 2012, which is hereby incorporated by reference in its entirety for all purposes.

BACKGROUND

Wideband receivers are configured to provide filtering to most out-of-band blocker signals before any baseband amplification. Wideband receivers can employ passive mixers that immediately down-convert an input current to baseband. A transimpedance amplifier (TIA) then converts any baseband current in the receive band to voltage.

A received radio frequency (RF) signal may include an unwanted blocker signal at frequency $f_b$, and a wanted signal at frequency $f_w$, which may be $\Delta f_b$ greater than $f_b$, e.g., $f_w = f_b + \Delta f_b$. However, these unwanted blocker signals experience some amplification around the RF band. This unnecessary amplification of unwanted blocker signals has potential to saturate the receiver, thus resulting in degradation of performance.

Additionally, the output of the TIA may have an unwanted signal that originates from harmonics of the wanted signal that experiences some amplification. Although the bandwidth around which these harmonics experience amplification can be very small, blocker signals located at these harmonic frequencies potentially cause the receiver to saturate, introducing distortion. For example, a receiver gain of 20× could potentially amplify a 1V blocker signal to 20V. This unnecessary amplification of blocker signals at the TIA output has potential to also saturate the receiver, thus resulting in further degradation of performance.

SUMMARY

A circuit and/or method is provided for a noise-cancelling receiver with baseband harmonic rejection and RF harmonic rejection, substantially illustrated by and/or described in connection with at least one of the figures, as set forth more completely in the claims.

BRIEF DESCRIPTION OF THE DRAWINGS

Certain features of the subject disclosure are set forth in the appended claims. However, for purpose of explanation, several implementations of the subject disclosure are set forth in the following figures.

DETAILED DESCRIPTION

It is understood that other configurations of the subject disclosure will become readily apparent to those skilled in the art from the following detailed description, wherein various configurations of the subject disclosure are shown and described by way of illustration. As will be realized, the subject disclosure is capable of other and different configurations and its several details are capable of modification in various other respects, all without departing from the scope of the subject disclosure. Accordingly, the drawings and detailed description are to be regarded as illustrative in nature and not as restrictive.

According to some implementations, the subject technology relates to a radio frequency (RF) receiver that includes a first set of transconductance cells configured to produce respective weighted current signals proportional to an input voltage signal. The RF receiver includes multiple frequency conversion cells coupled to the first set of transconductance cells and configured to mix the weighted current signals with a plurality of non-overlapping local oscillator (LO) signals to produce downconverted current signals. The RF receiver also includes multiple transimpedance amplifiers coupled to the plurality of frequency conversion cells and configured to produce output voltage signals proportional to the downconverted current signals. Each of the transimpedance amplifiers includes a second set of transconductance cells. Each of the first set and second set of transconductance cells has an effective transconductance of a first magnitude for frequency components of the input voltage signal arising from a first harmonic and an effective transconductance of a second magnitude less than the first magnitude for frequency components of the input voltage signal arising from harmonics at integer multiples of the first harmonic.

Figure 1:
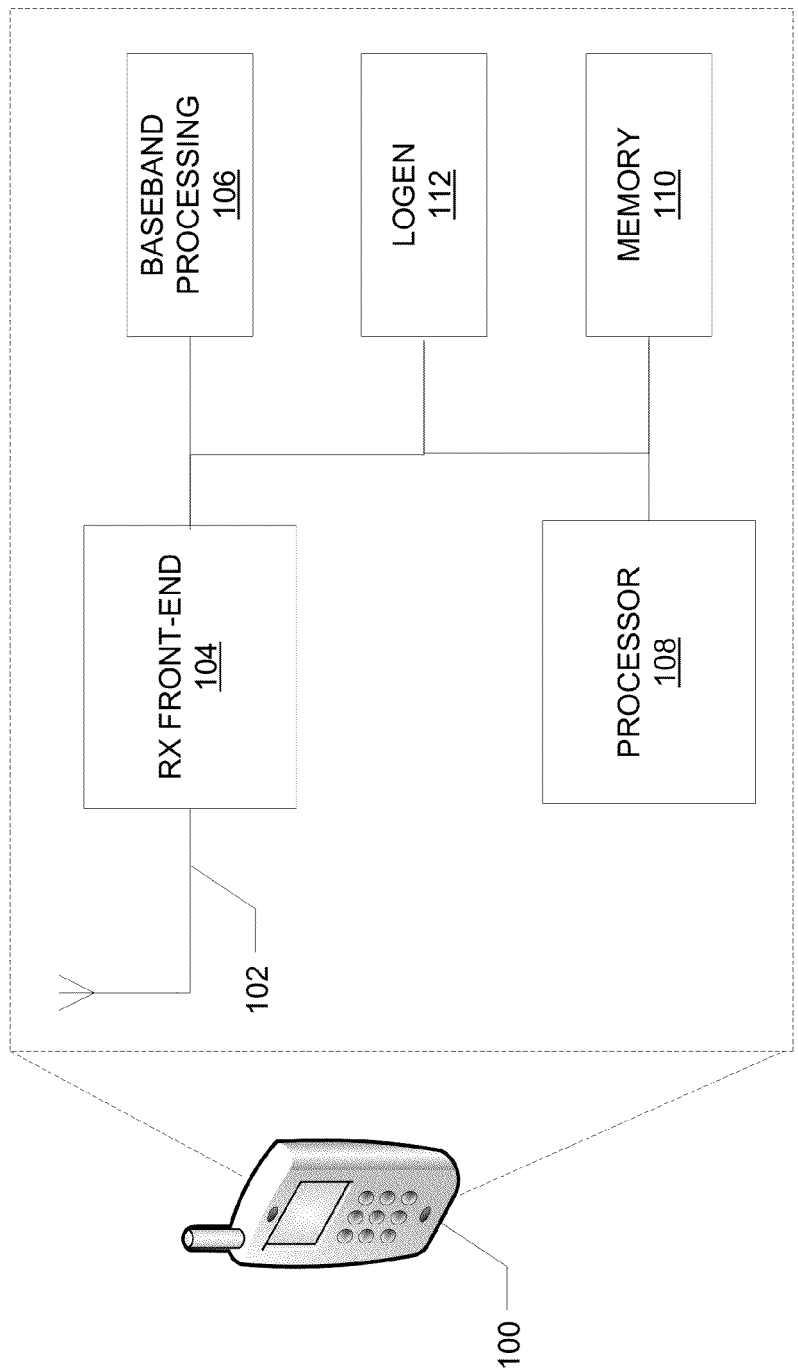
FIG. 1 illustrates a block diagram of a wireless communication device in accordance with one or more implementations.

FIG. 1 illustrates a block diagram of a wireless communication device 100 in which the subject technology may be used in accordance with one or more implementations. Referring to FIG. 1, the wireless communication device 100 includes an antenna 102, a receiver front-end 104, a baseband processing module 106, a processor 108, a memory 110, and a local oscillator generation module (LOGEN) 112. The blocks represented in FIG. 1 may be integrated on semiconductor substrates. For example, the blocks 104-112 may be realized in a single system-on-chip, or realized in a multi-chip chipset.

The antenna 102 is configured to transmit and/or receive wireless signals over a range of frequencies. Although a single antenna is illustrated, the subject disclosure is not so limited. The receiver front-end 104 includes logic, circuitry and/or interfaces that is operable to receive and process signals from the antenna 102. The receiver front-end 104, for example, may be operable to amplify and/or down-covert received wireless signals. The receiver front-end 104 also may be operable to cancel noise arising from impedance matching and may be linear over a wide range of frequencies. In this regard, the receiver front-end 104 may receive signals in accordance with a variety of wireless standards. The receiver front-end 104 may be applicable to standards, including but not limited to, Wi-Fi, WiMAX, Bluetooth, and various cellular standards.

The baseband processing module 106 includes logic, circuitry and/or interfaces that is operable to perform processing of baseband signals. The baseband processing module 106 may, for example, analyze received signals and generate control and/or feedback signals for configuring various components of the wireless communication device 100 such as the receiver front-end 104. The baseband processing module 106 is operable to encode, decode, transcode, modulate, demodulate, encrypt, decrypt, scramble, descramble, and/or otherwise process data in accordance with wireless standards.

The processor 108 includes logic, circuitry and/or interfaces that is operable to process data and/or control operations of the wireless communication device 100. In this regard, the processor 108 is configured to provide control signals to various other portions of the wireless communication device 100. The processor 108 may control transfers of data between various portions of the wireless communication device 100. Additionally, the processor 108 may provide for implementation of an operating system or otherwise execute code to manage operations of the wireless communication device 100.

The memory 110 includes logic, circuitry and/or interfaces for storage of various types of information such as received data, generated data, code, and/or configuration information.

The memory 110 may include a non-transitory storage medium, including but not limited to, RAM, ROM, flash, and/or magnetic storage. According to some implementations of the subject disclosure, information stored in the memory 110 is utilized for configuring the receiver front-end 104 and/or the baseband processing module 106.

The LOGEN 112 includes logic, circuitry and/or interfaces that is operable to generate oscillating signals at multiple frequencies. The LOGEN 112 may be operable to generate digital and/or analog signals. In this regard, the LOGEN 112 is operable to generate clock signals and/or sinusoidal signals. Characteristics of the oscillating signals such as the frequency and duty cycle may be determined based on control signals from the processor 108 and/or the baseband processing module 106.

In some implementations, the processor 108 configures the various components of the wireless communication device 100 based on a wireless standard according to which it is desired to receive signals. Wireless signals are received via the antenna 102, amplified and down-converted by the receiver front-end 104. The baseband processing module 106 may perform noise estimation and/or noise cancellation, decoding, and/or demodulation of the baseband signals. In this regard, information in the received signal is recovered and utilized appropriately. For example, the information may be audio and/or video to be presented to a user of the wireless communication device 100, data to be stored to the memory 110, and/or information affecting and/or enabling operation of the wireless communication device 100.

Figure 2:
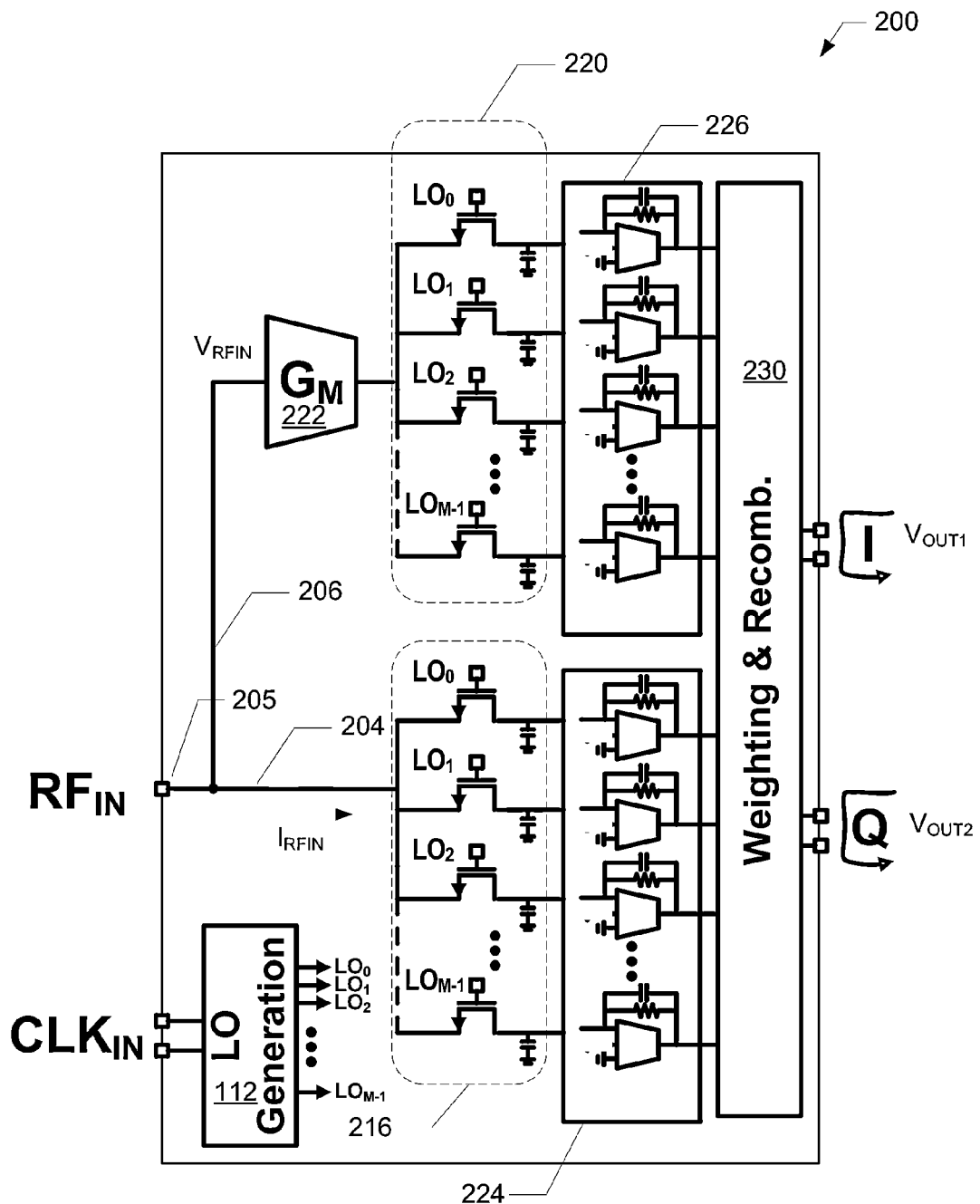
FIG. 2 illustrates a schematic diagram of a noise-cancelling receiver front-end in accordance with one or more implementations.

FIG. 2 illustrates a schematic diagram of a noise-cancelling receiver front-end 200 in accordance with one or more implementations. The main path of the receiver front-end 204 represents a mixer-first front-end (i.e. path through which IRFin is amplified). The receiver front-end 200 can be used in several different devices such as cell phones, wireless modems, wireless routers and access points to receive wireless RF signals.

The receiver front-end 200 connects to an antenna (not shown), and includes two down-conversion paths (e.g., a main downconversion path 204 and an auxiliary downconversion path 206), and a weighting and recombination module 230. The receiver front-end 200 also includes a transconductance cell 222, passive mixers 216 and 220, and transimpedance amplifiers 224 and 226.

In one or more implementations, the transconductance cell 222 is included in the auxiliary down-conversion path 206 to convert an RF signal input 205 (e.g., $V_{RFIN}$) into a corresponding current signal. The transconductance cell 222 can be implemented, for example, as an inverter. The transconductance cell 222 includes logic, circuitry and/or interfaces that is operable to output a current that is proportional to a voltage input to the transconductance cell 222.

The passive mixers 216 and 220 each include logic and/or circuitry that may provide for generation of inter-modulation products resulting from mixing the RF signal input 205 with LO signals (e.g., $LO_0$, $LO_1$, ..., $LO_{M-1}$) generated by the LOGEN 112 (FIG. 1). In one or more implementations, the passive mixers 216 and 220 are metal-oxide semiconductor field effect transistors (MOSFETs). Specifically, the passive mixers 216 and 220 are n-channel MOSFETs (e.g., NMOS). However, the passive mixers 216 and 220 can be implemented using other switching devices. In one or more implementations, the passive mixers 216 and 220 are configured to operate in their linear region when powered on.

The transimpedance amplifier (TIA) 226 includes logic, circuitry and/or interfaces that is operable to output a voltage that is proportional to a current input to the TIA 226. Similarly, the TIA 224 includes logic, circuitry and/or interfaces that is configured to output a voltage that is proportional to a current input to the TIA 224.

In operation, the two down-conversion paths 204 and 206 down-convert an RF signal received by the antenna (not shown) to baseband or some inter-frequency (IF) to cancel thermal noise generated by an input matching resistance, while avoiding voltage gain of the RF signal. The main down-conversion path 204 includes the passive mixer 216 to down-convert the current signal $I_{RFIN}$ by an amount equal to the frequency of a local oscillator signal (e.g., $LO_0$-$LO_{M-1}$). The current signal $I_{RFIN}$ includes both the RF signal and the thermal noise signal generated by the input matching resistance. The auxiliary down-conversion path 206 includes the passive mixer 220 to down-convert the voltage signal $V_{RFIN}$ by an amount equal to the frequency of a local oscillator signal used by the passive mixer 216. The frequency of the LO signal can be tuned, for example, over a frequency range based on a position of a desired channel in the spectrum of the received RF signal. Like the current signal $I_{RFIN}$, the voltage signal $V_{RFIN}$ includes both the RF signal and the thermal noise signal generated by an input matching resistance.

Although the thermal noise signal and the RF signal appear in both the current signal $I_{RFIN}$ and the voltage signal $V_{RFIN}$, it can be shown that the thermal noise signal in $V_{RFIN}$ is 180 degrees out of phase with the thermal noise signal in $I_{RFIN}$, while the RF signal in $V_{RFIN}$ is in-phase with the RF signal in $I_{RFIN}$. Given this, the transimpedance amplifiers 224 and 226 can be respectively used to convert and scale the down-converted current signals at the output of the passive mixers 216 and 220, into two voltage signals $V_{OUT1}$ and $V_{OUT2}$ such that, when $V_{OUT1}$ and $V_{OUT2}$ are added together by the weighting and recombination module 230 (or potentially sensed differentially depending on the relative polarities of the gains applied by the transfer functions), the thermal noise generated by input matching resistance is canceled, while the RF signal received by the antenna 102 is reinforced. In one or more implementations, the voltage signals $V_{OUT1}$ and $V_{OUT2}$ define the In-phase (I) and Quadrature (Q) components of the RF signal input 205.

The transfer functions of the transimpedance amplifiers 224 and 226 are determined based on their feedback networks. According to some implementations, the transimpedance amplifiers 224 and 226 include a resistive element and a capacitive element in parallel in their feedback networks. Capacitive elements can be included for stability purposes including resistive elements to set a current-to-voltage conversion gain for the transimpedance amplifiers 224 and 226, respectively. The number of transimpedance amplifiers included in each of the transimpedance amplifiers 224 and 226 may be at least comparable to the number of LO signals employed.

By employing the passive mixers 216 and 220 (which are bidirectional) and the transimpedance amplifiers 224 and 226, the virtual ground at the negative summing nodes of the transimpedance amplifiers 224 and 226 appears ideally at the RF side of the passive mixers 216 and 220 where the RF signal from the antenna 102 is received, thereby suppressing voltage swing prior to baseband or intermediate frequency (IF) filtering to remove blockers. Thus, because the receiver front-end 200 suppresses noise, while minimizing voltage gain, the receiver front-end 200 can be considered blocker-tolerant. In addition, because the passive mixer 216 is bidirectional, the noise of the transimpedance amplifier 224 up-converts at the input of the receiver front-end 200 and is canceled along with the thermal noise generated by the input matching resistance. The noise of the transimpedance amplifier 226 contributes negligibly when driven by a current source, such as the transconductance cell 222.

Following down-conversion of the RF signal received by the antenna 102 by the down-conversion paths 204 and 206 as described above, the baseband processing module 106 (FIG. 1) processes $V_{OUT1}$ and $V_{OUT2}$ using one or more processors and/or circuits. For example, baseband processing module 106 can low-pass filter $V_{OUT1}$ and $V_{OUT2}$, either separately or after having been added (or subtracted) together by the weighting and recombination module 230, to remove blockers and other interference. In addition, baseband processing module 106 can further perform digitization of $V_{OUT1}$ and $V_{OUT2}$, either separately or after having been added (or subtracted) together, using one or more analog-to-digital converters (ADCs). The ADCs can be, for example, delta-sigma ADCs. In addition, baseband processing module 106 can perform low-pass filtering and digitization of $V_{OUT1}$ and $V_{OUT2}$ in any order relative to each other. Further, baseband processing module 106 can demodulate the down-converted RF signal contained within $V_{OUT1}$ and $V_{OUT2}$ to recover information.

It should be noted that, in some implementations, the receiver front-end 200 can be further constructed as a fully differential receiver front-end. In other words, the receiver front-end 200 can be further constructed to process a differential RF signal received by the antenna 102 by replacing the transconductance cell 222 with a differential transconductance cell and by replacing the passive mixers in each down-conversion path 204 and 206 with differential passive mixers.

Figure 3:
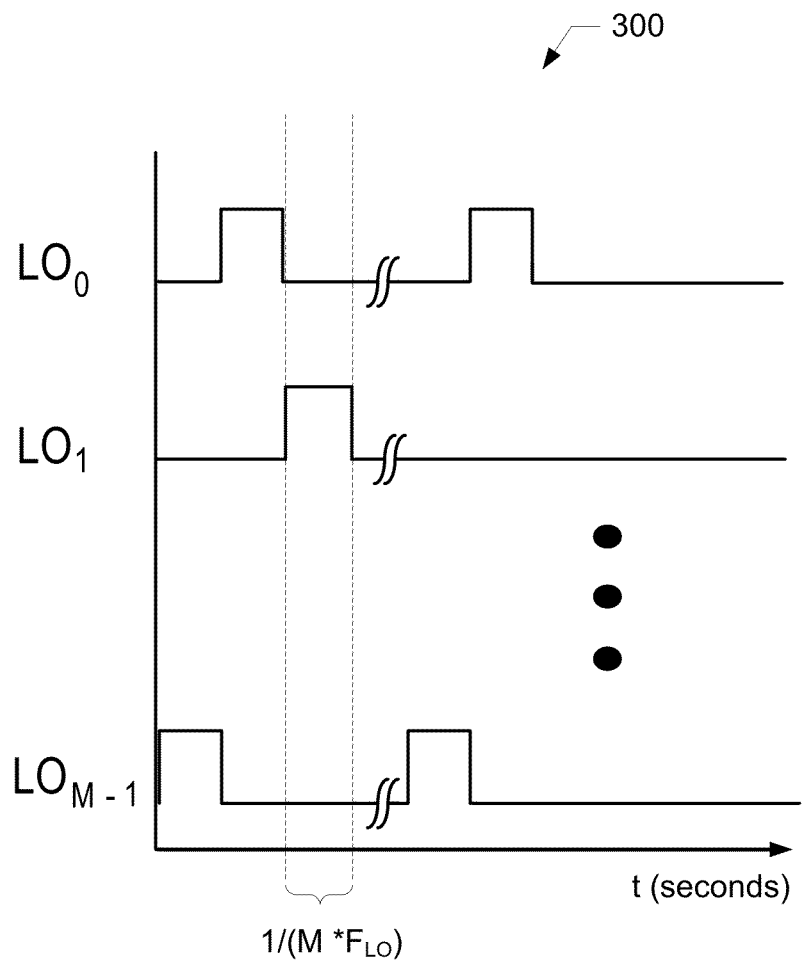
FIG. 3 illustrates a waveform diagram of local oscillator signals for use by the receiver front-end illustrated in FIG. 2 in accordance with one or more implementations.

FIG. 3 illustrates a waveform diagram of local oscillator signals for use by the receiver front-end 200 illustrated in FIG. 2 in accordance with one or more implementations. The LO signals 300 each correspond to a fundamental frequency (e.g., $\omega_{LO}$). Additionally, the LO signals 300 have successive phase shifts substantially equal to 360°/M and have duty cycles substantially equal to 1/M, where M is a number of LO signals employed.

According to some implementations, the LO signals 300 approximate a square waveform. Unlike a single-tone sinusoidal waveform, the square waveform contains harmonics at specific multiples of the fundamental frequency of the LO signal. Consequently, the output signal generated by the passive mixers 216 and 220 (FIG. 2) using the square waveform as a LO signal can contain harmonics corresponding to the LO frequency.

For example, when the number of harmonics presented around the fundamental frequency with a magnitude greater than the threshold magnitude is equal to eight, the LOGEN 112 (FIG. 1) can be configured to generate eight different LO signals (e.g., $LO_0$, $LO_1$, $LO_2$, up to $LO_7$) to address the eight harmonics. These eight LO signals each have successive phase shifts substantially equal to 360/8 degrees or 45 degrees. In addition, the duty cycle of each LO signal is substantially equal to ⅛ or 12.5%.

Figure 4:
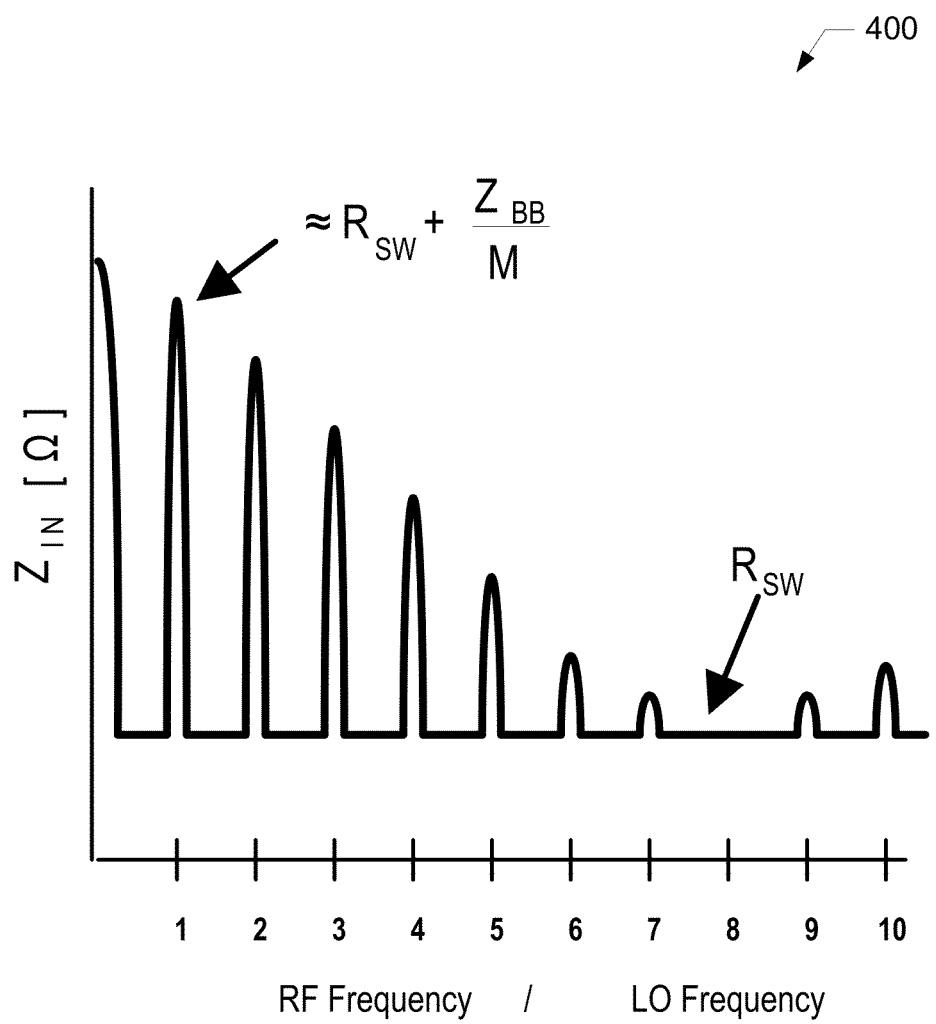
FIG. 4 illustrates a waveform diagram of an input impedance seen by the receiver front-end illustrated in FIG. 2 in accordance with one or more implementations.

FIG. 4 illustrates a waveform diagram of an input impedance seen by the receiver front-end 200 illustrated in FIG. 2 in accordance with one or more implementations. The waveform diagram 400 depicts the input impedance (or resistance (Ω)) as a function of the radio frequency (RF) normalized to local oscillator (LO) frequency. The input impedance seen from an input to the passive mixers 216 and 220 (FIG. 2), is equivalent to a switch resistance (e.g., $R_{SW}$) except around harmonics of the LO frequency where the input impedance is equivalent to:

$$Z_{IN} \approx R_{SW} + \frac{Z_{BB}}{M} \quad (1)$$

where M is a positive integer and represents the number of LO phases employed, $R_{SW}$ is the switch resistance of the passive mixers 216 and 220, and $Z_{BB}$ is the baseband impedance of the transimpedance amplifier 224 (FIG. 2). The harmonics having an input impedance greater than the switch resistance provide a pass-band at integer multiples of a fundamental frequency. As such, harmonics can be seen from the first frequency multiple (e.g., $1\omega_{LO}$) up to the seventh frequency multiple (e.g., $7\omega_{LO}$).

The switch resistance represents the impedance of switching devices that may be provided in the passive mixers 216 and 220. At these frequencies, the input impedance is equal to the baseband impedance frequency shifted to these frequencies (e.g., down-conversion, up-conversion). Thus, the input impedance, if inserted at a node inside the receiver front-end 200 (FIG. 1), all incoming frequencies at that node except those residing at the fundamental frequency (e.g., $\omega_{LO}$) and its harmonics are subject to attenuation. While it may be desirable to have an amplification system centered only around the LO frequency, components from around $2\omega_{LO}$ up to around $7\omega_{LO}$, for example, will receive some amplification (e.g., with less gain compared with the desired input components at $\omega_{LO}$), but with minimal folding.

Figure 5:
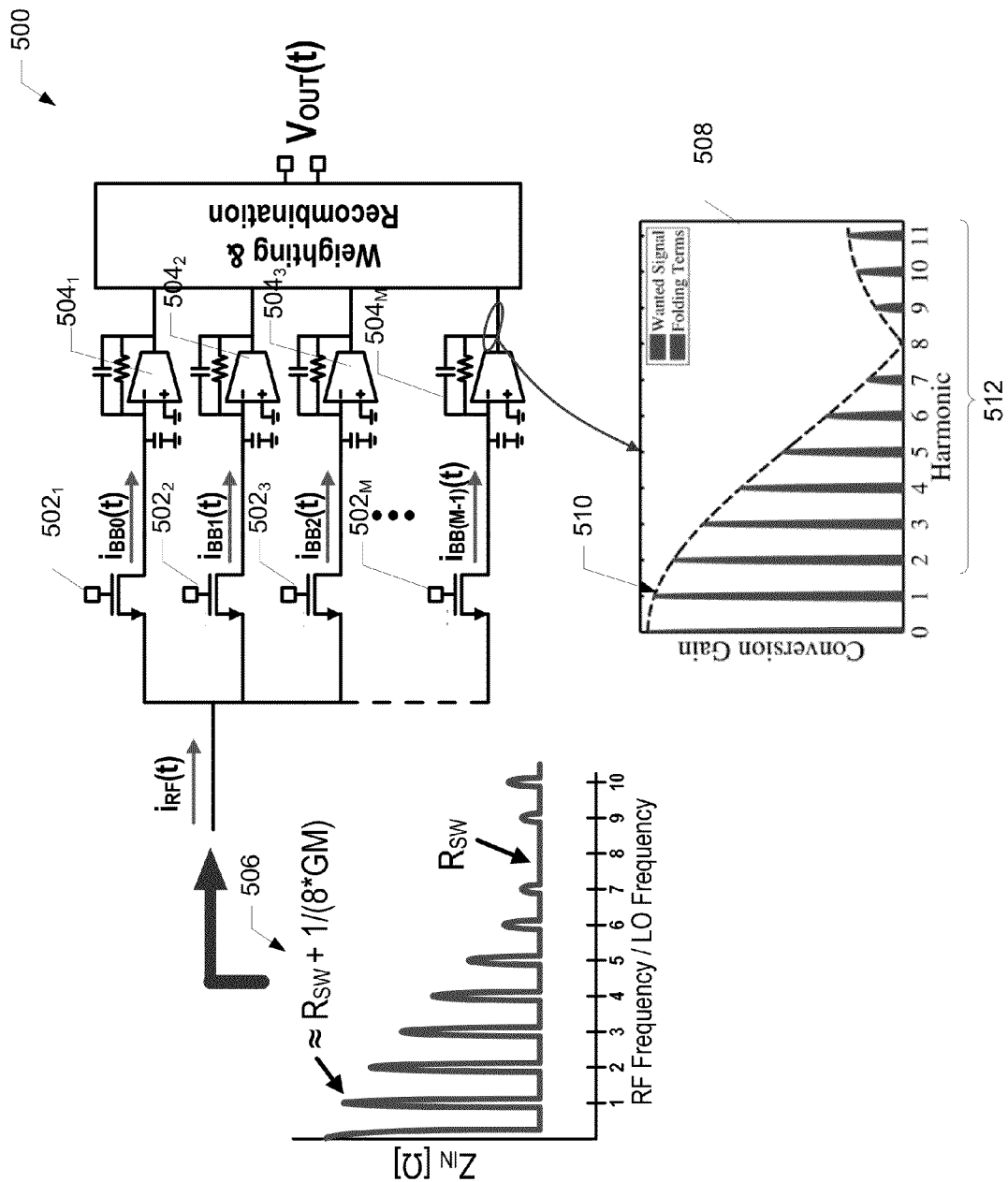
FIG. 5 illustrates a schematic diagram of an oversampling downconversion passive mixer in accordance with one or more implementations.

FIG. 5 illustrates a conceptual diagram of an oversampling down-conversion path 500 in accordance with one or more implementations. According to some implementations, the oversampling down-conversion path 500 is composed of switches $502_1$-$502_M$ and transimpedance amplifiers (TIAs) $504_1$-$504_M$, where M is a positive integer and represents the number of LO phases employed. The switches $502_1$-$502_M$ may collectively form the passive mixer 216 as discussed in FIG. 2. The TIAs $504_1$-$504_M$ may collectively form the TIA 224 as discussed in FIG. 2. The switches $502_1$-$502_M$ receive non-overlapping LO signals that are shifted by 360/M degrees from one another as illustrated in FIG. 3.

In operation, each of the switches $502_1$-$502_M$ down-converts an RF current input ($i_{RF}(t)$) using an input impedance profile 506, which defines impedances at harmonics of the corresponding RF or LO frequency. In a case of a mixer-first topology, the RF current input represents the input to the receiver front-end 104 (FIG. 1). Each of the TIAs $504_1$-$504_M$ receives a baseband current ($I_{BBM}(t)$) for conversion into a corresponding voltage output.

According to some implementations, the impedance at a first harmonic may be approximated as:

$$Z_{IN} \approx R_{SW} + \frac{1}{M * G_M} \quad (2)$$

where M is equal to the number of LO phases employed, $R_{SW}$ is the switch resistance of a respective one of the switches $502_1$-$502_M$, and $1/G_M$ is the input impedance of a respective one of the TIAs $504_1$-$504_M$. This corresponds to the series sum of the resistance of a single mixer switch and the up-converted impedance of the baseband TIAs. This is an idealized and simplified understanding, whereas an actual circuit implementation may result in a significantly altered impedance profile.

A waveform diagram 508 illustrates the conversion gain (e.g., y-axis) at each of the TIAs $504_1$-$504_M$ as a function of a harmonic multiple (e.g., x-axis). As illustrated, down-converted harmonics arising from integer multiples of the LO frequency (e.g., $2^{nd}$ through $7^{th}$ harmonics) may be present at the output of the TIAs. Accordingly, the down-conversion of unwanted signals produces folding terms that can saturate the receiver front-end 104 due to the gain compression caused by the blocker signals experiencing a voltage gain. The TIAs $504_1$-$504_M$ are typically configured to provide large voltage amplification. Therefore large blocker signals can introduce distortion, which can corrupt a wanted signal 510.

Figure 6:
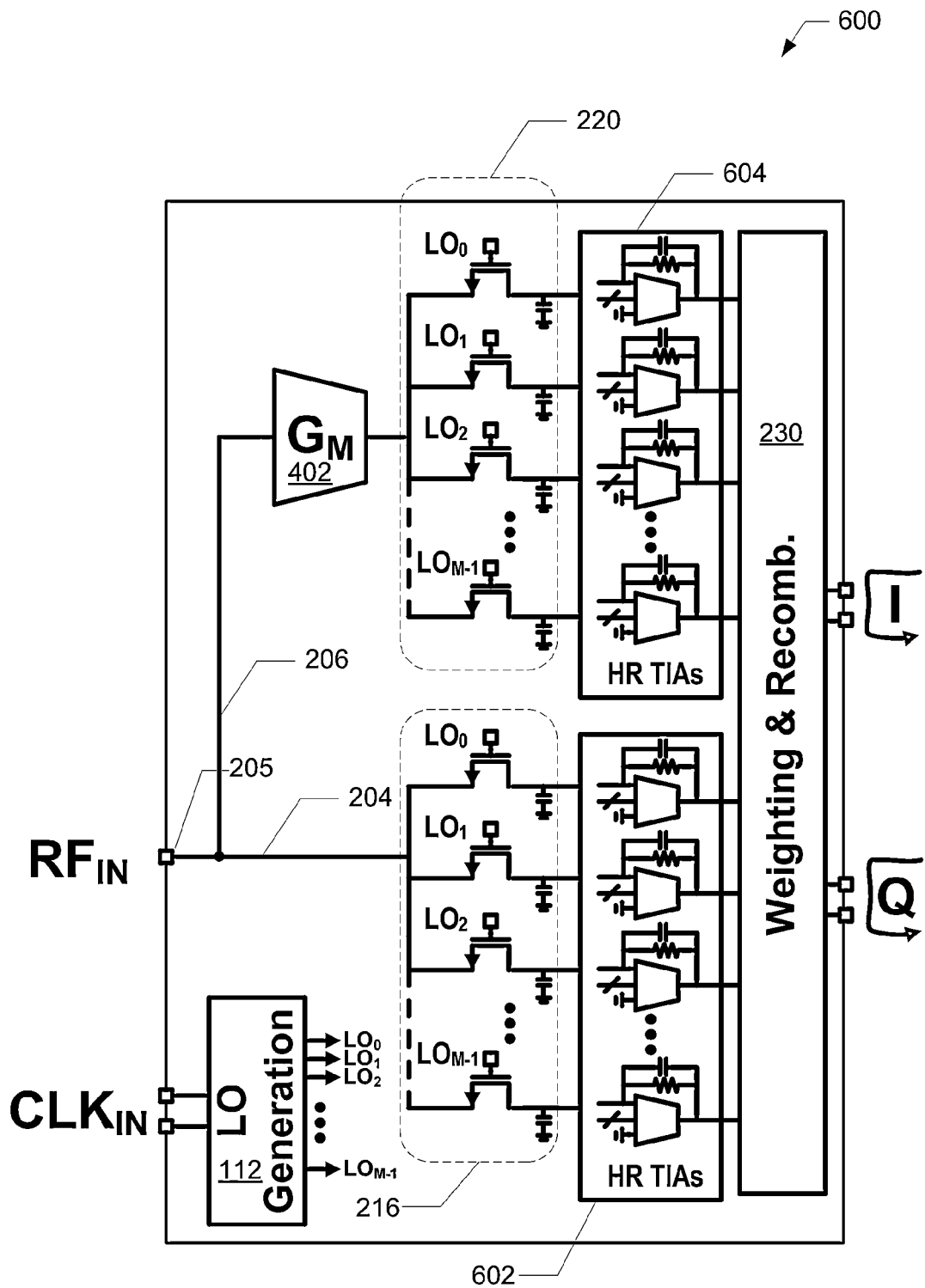
FIG. 6 illustrates a schematic diagram of a receiver front-end with baseband harmonic rejection in accordance with one or more implementations.

FIG. 6 illustrates a schematic diagram of a receiver front-end 600 with baseband harmonic rejection in accordance with one or more implementations. The subject technology provides for a baseband technique to prevent amplification of down-converted harmonic blockers by using multiple phases of the passive mixer output. In addition, the baseband technique improves the harmonic rejection properties of mixer-first receiver topologies.

According to some implementations, the subject technology relates to an apparatus within the receiver front-end 600 that is configured for baseband amplification with harmonic rejection, particularly for large harmonic blockers. The apparatus includes means for receiving a mixer signal down-converted from a radio frequency signal. The apparatus also includes means for converting the mixer signal into a weighted current signal proportional to a voltage corresponding to the mixer signal based on an effective transconductance. The apparatus also includes means for outputting the mixer signal with amplification using a feedback impedance such that a wanted signal receives the amplification and unwanted signals are rejected without amplification. The effective transconductance has a first magnitude for frequency components of the down-converted signal arising from a first harmonic and the effective transconductance has a second magnitude less than the first magnitude for frequency components of the down-converted signal arising from harmonics at integer multiples of the first harmonic.

In one or more implementations, the receiver front-end 600 provides transimpedance amplifiers (TIAs) 602 and 604 to be configured to receive M downconversion signals from respective ones of the passive mixers 216 and 220. Each of the TIAs 602 and 604 includes multiple transconductance cells with a particular transconductance weighting to output a weighted current signal. Outputs of the TIAs 602 and 604 are coupled to a common feedback impedance, which is coupled to an input of a respective one of the TIAs 602 and 604 to convert the weighted current signal into a voltage output with a voltage gain such that the wanted signal arising from a first harmonic realizes the voltage gain and unwanted signals corresponding to harmonics at integer multiples of the first harmonic are rejected without amplification.

Referring to FIG. 6, the receiver front-end 600 connects to an antenna (not shown), and includes two down-conversion paths 204 and 206, and a weighting and recombination module 230. The receiver front-end 600 also includes a transconductance cell 222, passive mixers 216 and 220, and TIAs 602 and 604. The passive mixers 216 and 220 each include logic and/or circuitry that may provide for generation of intermodulation products resulting from mixing an RF signal input 205 (e.g., $RF_{IN}$) with LO signals generated by the LOGEN 112 (FIG. 1).

The receiver front-end 600 has a similar structure as the receiver front-end 200 illustrated in FIG. 2 and operates in substantially the same manner. However, the receiver front-end 600 provides the transimpedance amplifiers 602 and 604 having enhanced harmonic rejection circuitry. The transimpedance amplifiers 602 and 604 are configured to receive multiple mixer signals from the passive mixers 216 and 220 that were mixed with all of the LO signals generated by the LOGEN 112. That is, each respective TIA receives a bus of mixer signals to selectively amplify frequency components of the RF signal input 205 that correspond to a wanted harmonic.

Figure 7:
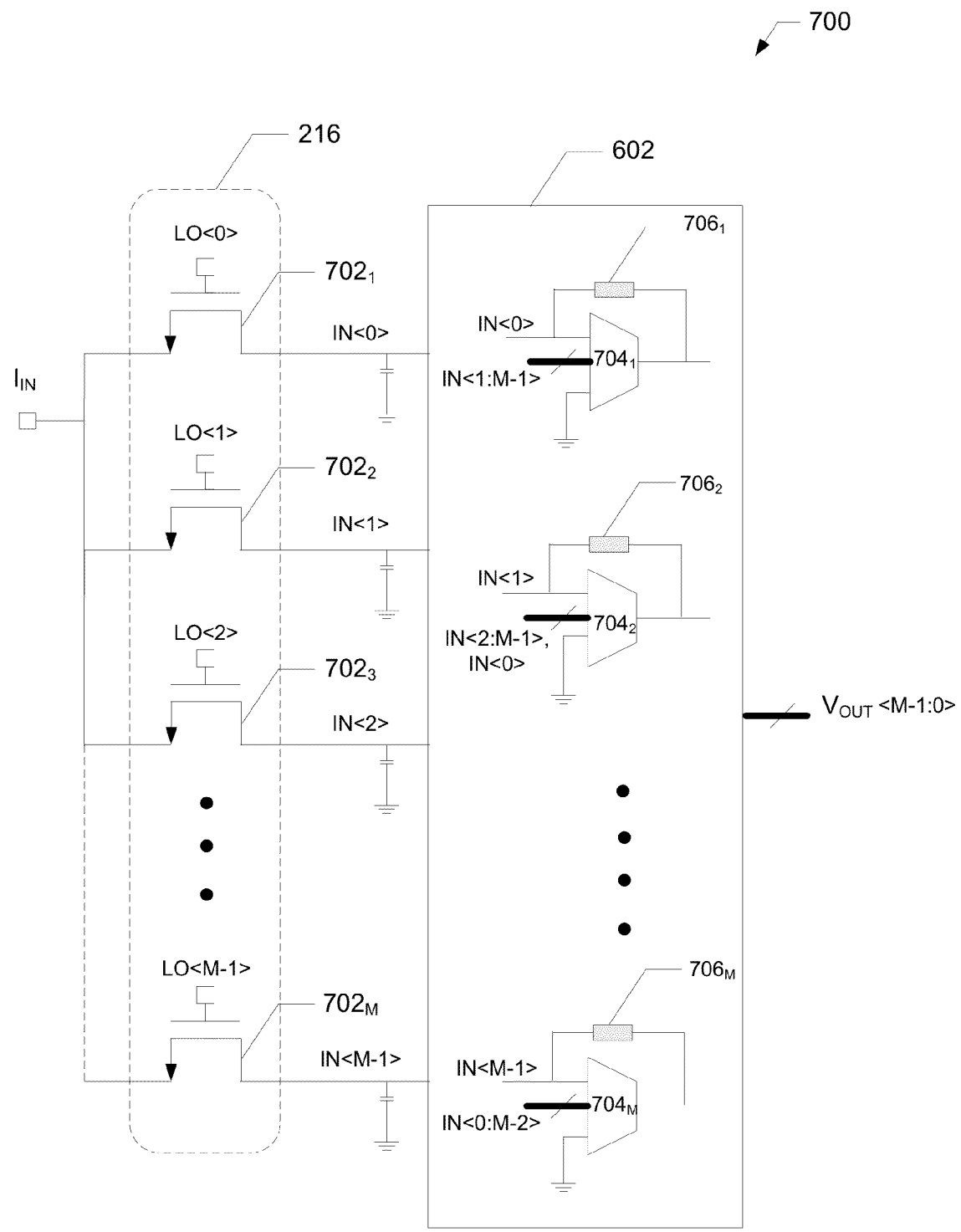
FIG. 7 illustrates a schematic diagram of an oversampling downconversion passive mixer with baseband harmonic rejection provided in the receiver front-end illustrated in FIG. 6 in accordance with one or more implementations.

FIG. 7 illustrates a schematic diagram of an oversampling down-conversion path 700 with baseband harmonic rejection in accordance with one or more implementations. Referring to FIG. 7, the oversampling down-conversion path 700 includes switches 702₁-702$_M$ and a bank of transimpedance amplifiers 602. The bank of transimpedance amplifiers 602 is composed of TIAs 704₁-704$_M$. Each of the TIAs 704₁-704$_M$ includes a feedback circuit (e.g., 706₁-706$_M$). Each of the feedback circuits 706₁-706$_M$ includes one or more components (e.g., a capacitor, a resistor) for setting a gain and/or frequency response of the corresponding one of the TIAs 704₁-704$_M$. According to some implementations, M is equal to an even integer, including but not limited to, 8, 16, and 32.

In one or more implementations, the TIAs 704₁-704$_M$ are configured to receive M down-conversion signals from respective ones of the switches 702₁-702$_M$. Each of the TIAs 704₁-704$_M$ includes multiple transconductance cells with a particular transconductance weighting to output a weighted current signal. A feedback impedance (e.g., feedback circuits 706₁-706$_M$) is coupled between an input of a respective one of the transconductance cells and outputs of the TIAs 704₁-704$_M$ to convert the weighted current signal into a voltage output with a voltage gain such that the wanted signal arising from a first harmonic realizes the voltage gain and unwanted signals corresponding to harmonics at integer multiples of the first harmonic are rejected without amplification.

Each of the TIAs 704₁-704$_M$ is configured to provide baseband amplification with harmonic rejection. The TIAs 704₁-704$_M$ are operable to convert an input current signal into an output voltage signal proportional to the input current signal. For example, each of the TIAs 704₁-704$_M$ amplifies a down-converted signal from an output of one of the switches 702₁-702$_M$ into a corresponding voltage signal.

In one or more implementations, the switches 702₁-702$_M$ collectively form the passive mixer 216 (FIG. 6) and each include, for example, a single NMOS transistor. Multiple LO signals (e.g., LO<M−1:0>), each phase-shifted with respect to one another, are generated by the LOGEN 112 (FIG. 1). Each of the switches 702₁-702$_M$ receives one of the LO signals. For example, for M=8, 8 LO signals corresponding to 8 phases are generated and each are configured to have a 12.5% duty-cycle such that only one of the 8 LO signals is in a logic-high state at a given time instant. As such, the outputs from the switches 702₁-702$_M$ are identical in magnitude but shifted in phase by 360/M degrees.

Each of the TIAs 704₁-704$_M$ receives a different ordering of the passive mixer outputs. For example, the first TIA 704₁ receives a signal (e.g., IN<0>) via a first input port and the remaining signals (e.g., IN<1:M−1>) via respective input ports. The second TIA 704₂ receives a mixed signal (e.g., IN<1>) via a first input port and the remaining mixed signals (e.g., ordered as IN<2:M−1>, IN<0>) via respective input ports. Additionally, the last TIA 704$_M$ receives a mixed signal (e.g., IN<M−1>) via a first port and the remaining mixed signals (e.g., IN<0:M−2>) via respective ports.

In operation, an input current signal, $I_{RFIN}$, is received and processed via a signal path including the switches 702₁-702$_M$ and the TIAs 704₁-704$_M$. Each of the switches 702₁-702$_M$ is configured to mix the input current signal with a respective LO signal to downconvert the received input current signal to baseband (e.g., reduce frequency to a baseband or intermediate frequency). The baseband output of each of the switches 702₁-702$_M$ is input to a corresponding one of the TIAs 704₁-704$_M$. Each of the TIAs 704₁-704$_M$ converts the current output of a corresponding one of the switches 502₁-502$_M$ to a corresponding voltage. There is a gain associated with the current-to-voltage conversion.

The combined output voltage, $V_{OUT}$<M−1:0> may be preconfigured and/or dynamically configured during operation of the oversampling down-conversion path 700 to maintain, within a tolerance, the following relationship:

$$V_{OUT} = R_{RF} I_{IN}, \text{ where } m = 1 +/- kM, \text{ otherwise } 0. \quad (3)$$

where $R_{RF}$ is the resistance of the input RF signal, $I_{IN}$ is the current of the input RF signal, k is any integer, and M represents the number of LO phases employed. That is, the effective transconductance for harmonics around a wanted signal causes a current change through the transconductance cell to realize a voltage output; whereas, the effective transconductance for harmonics at integer multiples of the wanted signal is equal to zero.

The effective input impedance is approximately given by:

$$Z_{IN} = 1/G_m, \text{ where } m = 1 +/- kM, \text{ otherwise } \infty. \quad (4)$$

where m is the LO harmonic from where the signal originated (e.g., m=1 for a wanted signal, and m=3 from an unwanted blocker from around the 3$^{rd}$ LO harmonic), k is any integer, M represents the number of LO phases employed.

Figure 8:
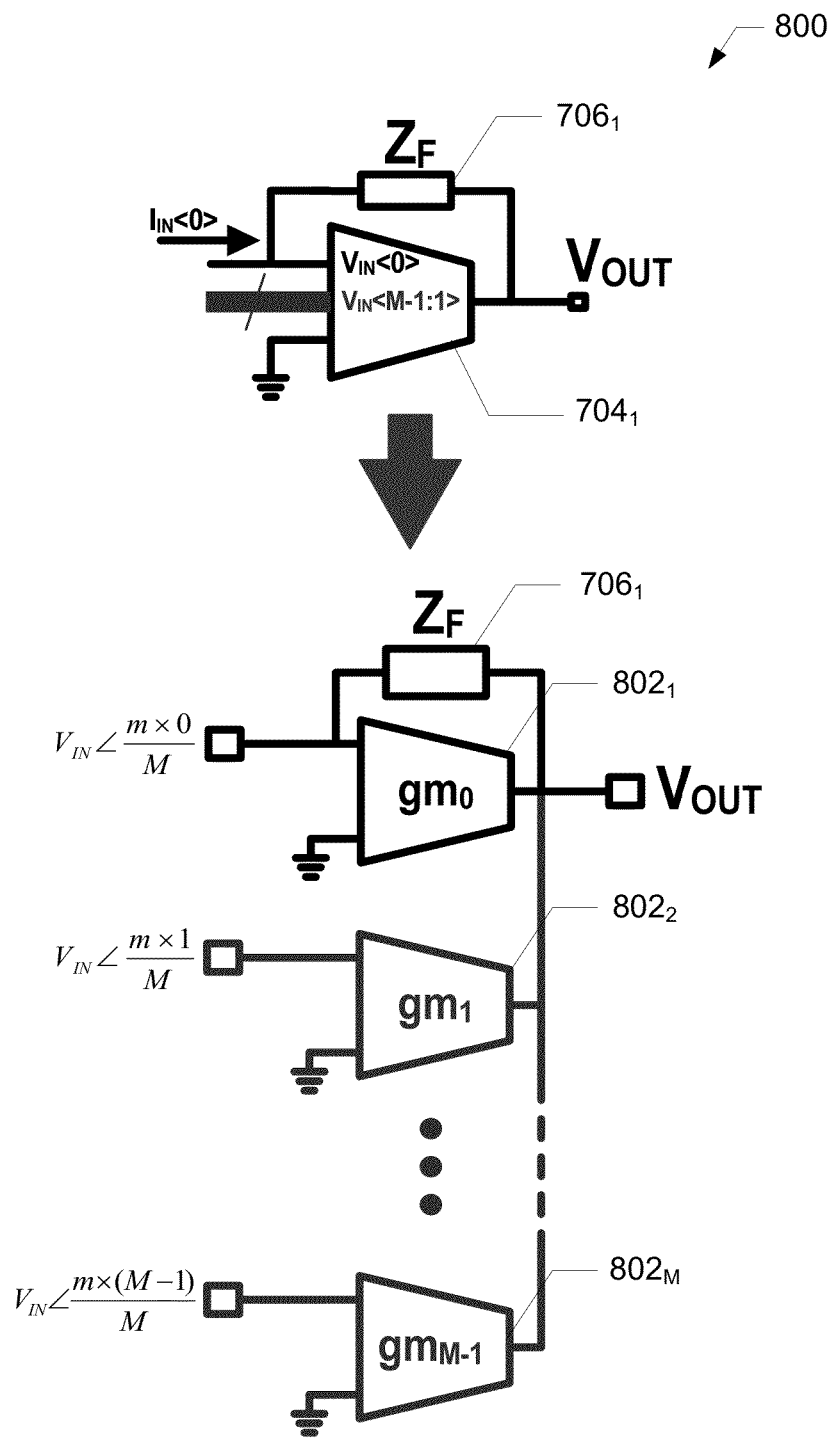
FIG. 8 illustrates a schematic diagram of a single transimpedance amplifier used in the oversampling downconversion passive mixer illustrated in FIG. 7 in accordance with one or more implementations.

FIG. 8 illustrates a schematic diagram of a single transimpedance amplifier used in the oversampling down-conversion path 700 illustrated in FIG. 7 in accordance with one or more implementations. The receiver front-end 200, as discussed with respect to FIG. 2, is enhanced with baseband harmonic rejection. For example, the TIAs 704₁-704$_M$ (FIG. 7) can each be expanded to include multiple transconductance cells 802₁-802$_M$ (e.g., labeled gm₀-gm$_{M-1}$) to receive the down-converted signals from respective ones of the switches 702₁-702$_M$ (FIG. 7), where M is a positive integer and represents the number of LO phases employed. A feedback impedance, which is coupled between an input of one of the transconductance cells 802₁-802$_M$ (e.g., 802₁) and outputs of the transconductance cells, is provided to the transconductance cell (e.g., gm₀) to convert a down-converted signal into a voltage output with a voltage gain.

Each down-converted signal has a wanted signal arising from a first harmonic and unwanted signals arising from harmonics of the wanted signal. In one or more implementations, the input voltage, $V_{IN}$, to each transconductance cell is preconfigured and/or dynamically configured during operation of the single transimpedance amplifier 800 to maintain, the following relationship:

$$V_{IN} L \frac{m*(M-1)}{M}$$

where m is the LO harmonic from where the signal originated (e.g., m=1 for the wanted signal, and m=3 from an unwanted blocker from around the 3$^{rd}$ LO harmonic), and M represents the number of LO phases employed. Here, the input voltage defines a geometric relationship between the voltages corresponding to respective harmonics applied to the transconductance cells 802₁-802$_M$. As such, the input voltages cause each of the transconductance cells 802₁-802$_M$ to be weighted accordingly such that their effective transconductance realizes a current change through the transconductance cell for outputs corresponding to a wanted signal.

By appropriately weighting the M transconductance cells in each of the TIAs 704₁-704$_M$, the harmonic rejection circuit can be configured to amplify the wanted down-converted signal arising from the first harmonic (e.g., m=1), but reject without amplification all unwanted signals that arise from harmonics of the wanted signal (up to the M−1$^{th}$ harmonic). This is so because the weighting causes the effective transconductance of the transconductance cell $802_1$ to be large when excited by signals arising from m=1, but zero otherwise. In other words, the weighting causes certain current signals to shift in phase such that signals with opposing phases cancel one another at the output (e.g., $V_{OUT}$), thus resulting in no voltage gain for the canceled current signals. Given that there is no amplification of harmonic blockers at outputs of the TIAs $704_1$-$704_M$ with the enhanced harmonic rejection circuit, no harmonic blockers up to the (M−1)$^{th}$ harmonic can saturate the receiver. According to some implementations, the transconductance cells $802_1$-$802_M$ are configured to only amplify a signal from a harmonic (not just M=1, e.g., M=3), and further configured to only amplify signals arising from more than one harmonic multiple of LO (e.g., signals from M=1 and M=3).

In one or more implementations, each of the multiple transconductance cells $802_1$-$802_M$ has a transconductance weighting equivalent to:

$$gm_X = k\left[1 + \cos\left(\frac{2\pi X}{M}\right)\right], X = [0, 1, 2, \ldots M-1] \quad (6)$$

or possibly, $$gm_X = k\left[\cos\left(\frac{2\pi X}{M}\right)\right], X = [0, 1, 2, \ldots M-1] \quad (7)$$

when a fully differential receiver (that uses fully-differential passive mixers) is employed, where X is an integer that represents an individual transconductance cell (e.g., $802_1$-$802_M$), M is the number of LO phases employed, and k is an arbitrary constant that determines the effective transconductance of the transconductance cell. As such, the transconductance gain is shifted to reject integer multiples of the wanted signal. The transconductance based on equation (6) can provide more immunity to blockers arising from even-numbered harmonics than the transconductance based on equation (7), but may utilize more current for the same noise performance.

Alternatively, when differential mixers are employed (in other words fully differential RF inputs are available), each of the transconductance cells $802_1$-$802_M$ has a transconductance weighting equivalent to equation (7), as shown above, where M is a positive integer and represents the number of LO phases employed. As such, the transconductance gain is shifted to reject odd integer multiples of the wanted signal only.

The transconductance cells $802_1$-$802_M$ can be implemented using other transconductance devices. The harmonic rejection circuit can be implemented in a voltage amplifier, current amplifier, operational amplifier, signal amplifier or any variation of transconductance. The harmonic rejection circuit also can be applied to single-stage amplifiers or amplifiers employing multiple amplification stages. According to some implementations, the single transimpedance amplifier 800 and the above-described elements are varied and are not limited to the functions, structures, configurations, implementations or examples provided.

Figure 9:
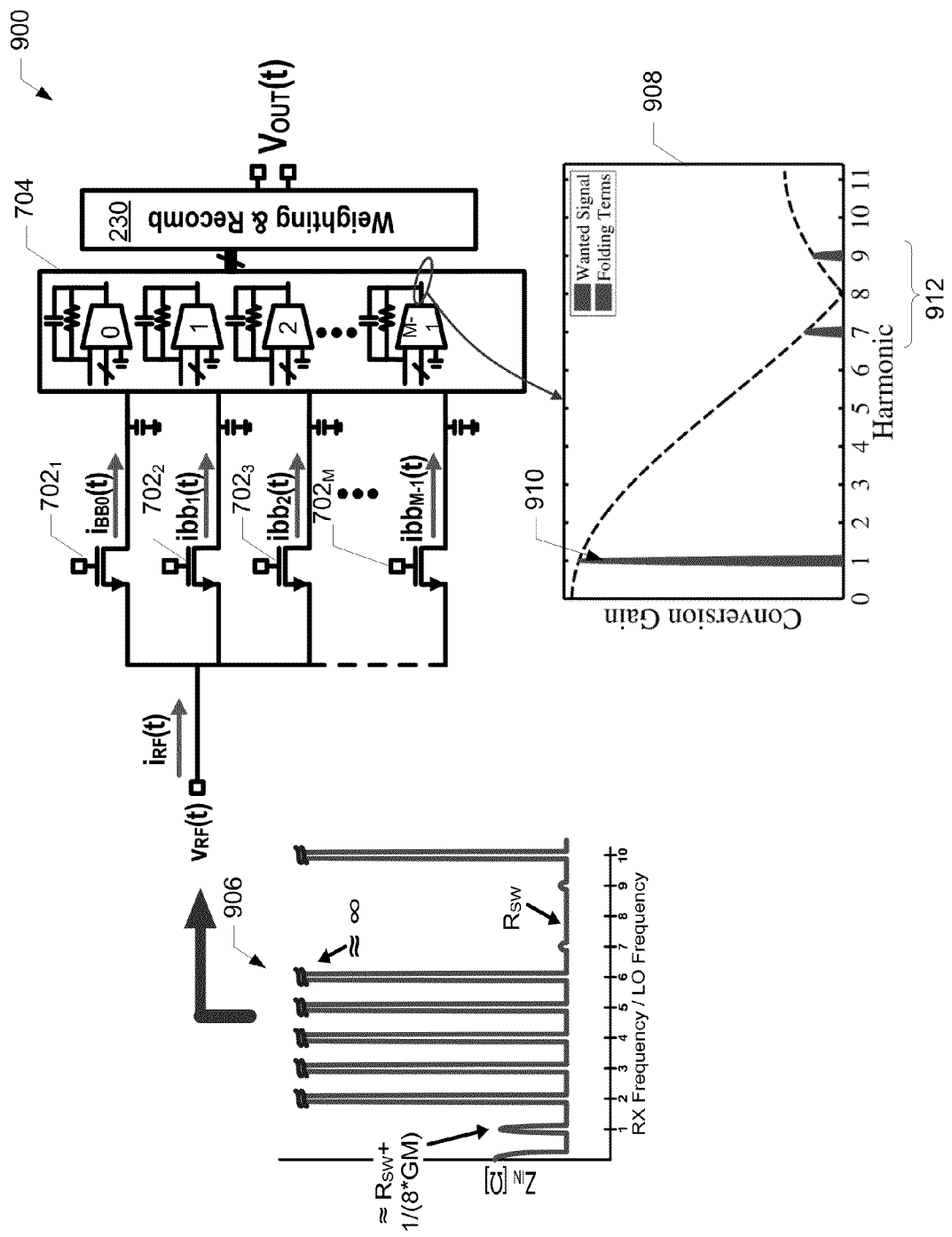
FIG. 9 illustrates a conceptual diagram of the oversampling downconversion passive mixer with baseband harmonic rejection in accordance with one or more implementations.

FIG. 9 illustrates a conceptual diagram 900 of the oversampling down-conversion path 700 with baseband harmonic rejection illustrated in FIG. 7 in accordance with one or more implementations. In operation, each of the switches $702_1$-$702_M$ receives an RF current signal (e.g., $I_{RF}(t)$) using an input impedance profile 906 that defines impedances at harmonics of the corresponding radio frequency or LO frequency. For example, the resistance at a first harmonic may be approximated according to equation (2), shown above, where M represents the number of LO phases employed, $R_{SW}$ is the switch resistance of a respective one of the switches $702_1$-$702_M$, and $1/G_M$ is the input impedance of a respective TIA in the transimpedance amplifier 702. This corresponds to the series sum of the resistance of a single switch and the up-converted impedance of the baseband TIAs. This is an idealized and simplified understanding, whereas an actual circuit implementation may result in a significantly altered impedance profile. Each of the TIAs provided in the transimpedance amplifier 702 receives a baseband current ($I_{BBM}(t)$) for conversion into a corresponding voltage output. Here, FIG. 9 assumes M=8.

Based on the input impedance profile 906, only the first harmonic excites a voltage gain since the transconductance weighting ensures that unwanted harmonics do not excite a current from the transconductance cell (or equivalently the effective transconductance of the transconductance cell to drop to zero). Additionally, the input impedance profile 902 defines impedances between the 2$^{nd}$ and 7$^{th}$ harmonics as substantially large (e.g., infinity). Because the unwanted signals (or folding terms) do not realize voltage amplification, the gain compression is reduced around these LO harmonic frequencies.

A waveform diagram 908 illustrates the conversion gain at each of the TIAs provided in the transimpedance amplifier 704 as a function of a harmonic multiple. As illustrated, a wanted signal 910 and minimal feed-through signals are realized at certain frequencies in the receive band. Accordingly, the folding terms are reduced such that only unwanted folding terms around the 7$^{th}$ and 9$^{th}$ harmonics of the wanted signal 910 are realized, which are of negligible magnitude. The wanted signal 910 around the 1$^{st}$ harmonic realizes a voltage gain based on the input impedance profile 902.

Figure 10:
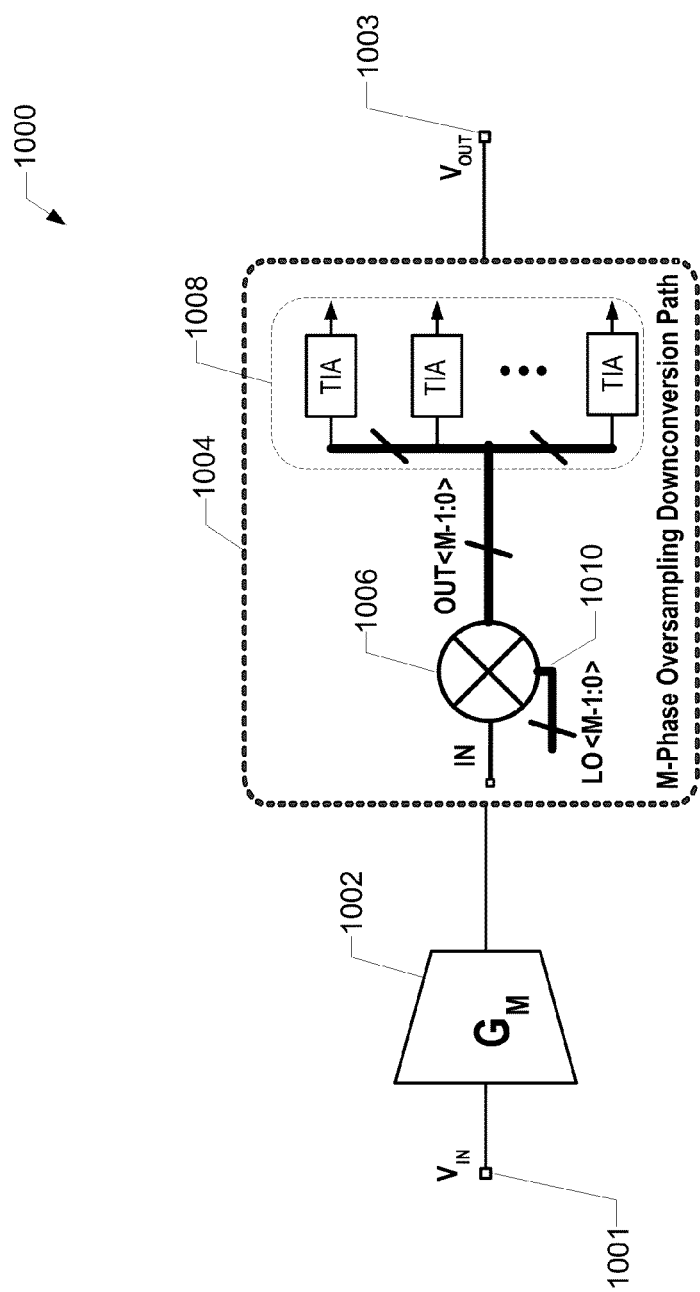
FIG. 10 illustrates a schematic diagram of a current-source downconversion path provided in the receiver front-end illustrated in FIG. 2 in accordance with one or more implementations.

FIG. 10 illustrates a schematic diagram of a current-source downconversion path 1000 provided in the receiver front-end 200 illustrated in FIG. 2 in accordance with one or more implementations. The current-source downconversion path 1000 employs a transconductance cell 1002 coupled to an M-phase oversampling downconversion path 1004. The M-phase oversampling downconversion path 1004 includes a passive mixer 1006 and transimpedance amplifiers (TIAs) 1008.

In one or more implementations, the M-phase oversampling downconversion path 1004, illustrated in FIG. 10, provides viable implementations for use within many RF receiver designs. However, for wideband RF receivers, the higher-order harmonic effects that result from the passive mixer 1006 of the M-phase oversampling downconversion path 1004 can cause significant interference with a desired portion of the RF signal.

Referring to FIG. 10, the M-phase oversampling downconversion path 1004 is single-ended and processes a single-ended RF signal, via a transconductance cell 1002, received at a node 1001. The passive mixer 1006 is configured to translate the RF current to a baseband frequency. As the passive mixer is bidirectional, the passive mixer 1006 is also translates the input impedance of the TIAs 1008 to a higher frequency substantially equal to a fundamental frequency (e.g., $\omega_{LO}$) of local oscillator (LO) signals 1010 received by the passive mixer 1006. In addition, the transconductance cell 1002 realizes a voltage gain $\left(\text{e.g., } \frac{V_{OUT}}{V_{IN}}\right)$ between the node 1001 and the node 1003, where Vout is considered at RF, while Vout is considered at baseband.

Since the impedance of the TIAs 1008 may vary with the frequency of the signal applied thereon, it follows that the frequency conversion of the RF signal by the passive mixer 1006 alters the impedance seen by the RF signal at the node 1001. Specifically, the input impedance of the TIAs 1008 will each appear translated by $\pm \omega_{LO}$ (e.g., the fundamental frequency of the LO signals 1010) as seen by the RF signal at the node 1001.

The current-source downconversion path 1000 provides frequency translation of the RF signal at the node 1001 by the sum $(\omega_{RF}+\omega_{LO})$ and difference $(\omega_{RF}-\omega_{LO}$ or $\omega_{LO}-\omega_{RF})$ in frequency between the LO signals 1010 and the input signal at the node 1001. However, due to upper harmonics of the LO signals 1010, it can be shown that the current-source downconversion path 1000 further provides frequency conversion of the RF signal by the sum $(\omega_{RF}+(M-1)*\omega_{LO})$ and difference $(\omega_{RF}-(M-1)*\omega_{LO}$ or $(M-1)*\omega_{LO}-\omega_{RF})$ in frequency between the $(M-1)^{th}$ harmonic of the LO signals 1010 and the RF signal, where M defines the number of LO phases employed. Frequency conversion of the RF signal by the sum and difference in frequency between the $(M-1)^{th}$ harmonic of the LO signals 1010 and the RF signal is undesired and can create adverse effects, especially in wideband applications.

The RF signal received at the node 1001 illustrates a range of frequencies, $\omega_A-\omega_B$, that contain desired information. The translated baseband impedance $Z_{IN}$ is centered within a certain portion of the frequency band $\omega_A-\omega_B$, such that desired information contained at and around that frequency within the RF signal can be retrieved. Specifically, the translated baseband impedance is centered at $\omega_{LO}$.

Figure 11:
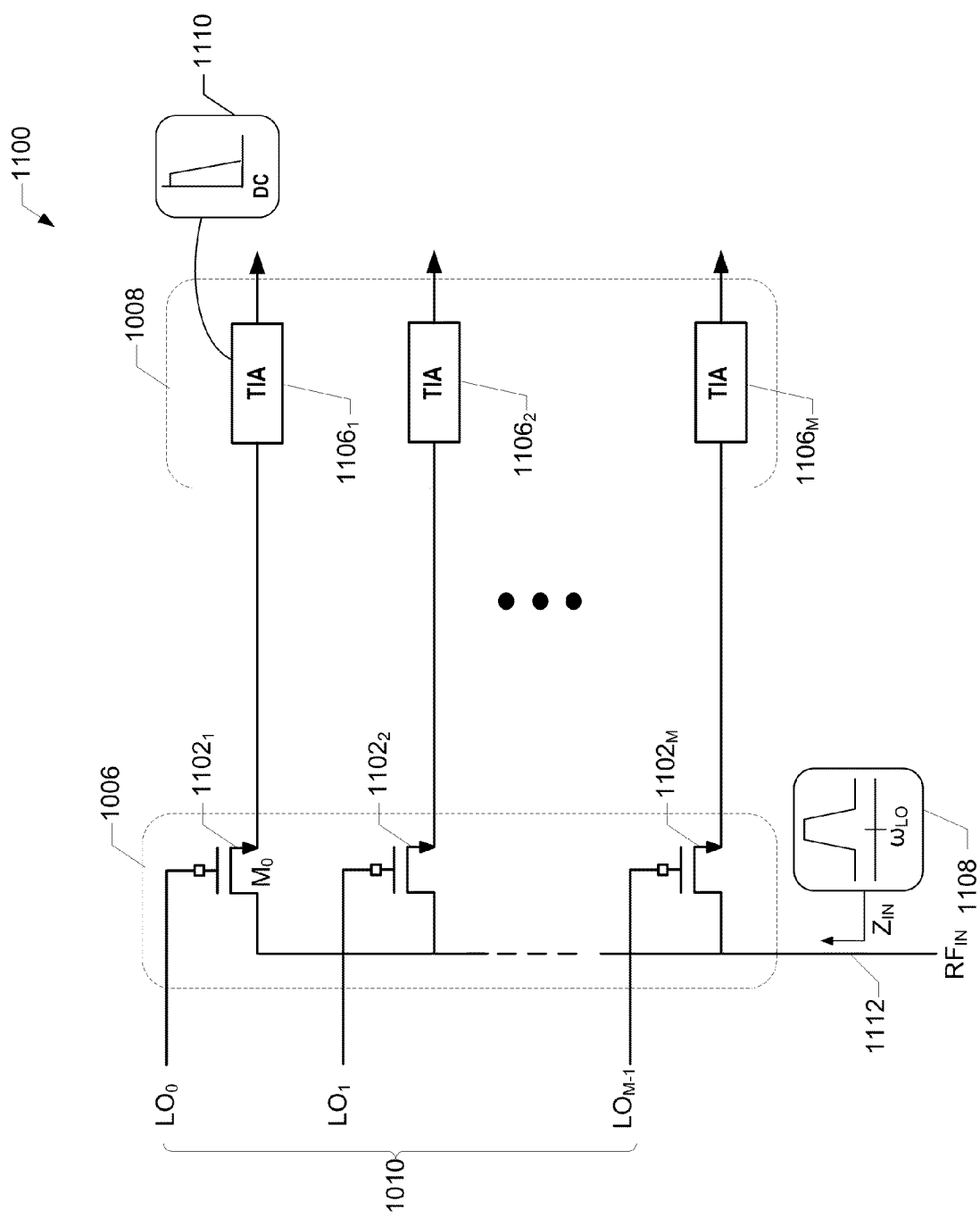
FIG. 11 illustrates a schematic diagram of an oversampling passive mixer provided in the current-source downconversion path illustrated in FIG. 10 in accordance with one or more implementations.

FIG. 11 illustrates a schematic diagram of an oversampling downconversion path 1100 provided in the current-source downconversion path 1000 illustrated in FIG. 10 in accordance with one or more implementations. As noted above, the oversampling downconversion path 1100 in its single-ended format, is composed of the passive mixer 1006 (FIG. 10) and the TIAs 1008 (FIG. 10). According to some implementations, the passive mixer 1006 is composed of switching devices $1102_1$-$1102_M$ and the TIAs 1008 is composed of TIAs $1106_1$-$1106_M$, where M represents the number of LO signals employed.

The passive mixer 1006 uses the local oscillator (LO) signals 1010 (FIG. 10) to down-convert or up-convert an RF signal input 1112 (e.g., $RF_{IN}$). For example, the passive mixer 1006 is configured to down-convert the RF signal input 1112 using respective ones of the LO signals 1010. Specifically, during down-conversion, harmonics of the LO signal cause RF input signals at multiples of the LO frequency to directly interfere with each other in a resulting baseband or intermediate frequency (IF) signal.

The passive mixer 1006 provides multiple frequency conversion branches. Each frequency conversion branch includes a switching device coupled at its gate to a respective one of the LO signals 1010, at its source to the RF signal input 1112, and at its drain to a respective one of the TIAs 1008. For example, the first frequency conversion branch illustrated in FIG. 11 includes a switching device $1102_1$ represented as an n-type metal oxide semiconductor (NMOS) device $M_0$, which is coupled at its gate to a LO signal $LO_0$, at its source to the RF signal input 1112, and at its drain to a baseband impedance $1106_1$. The switching devices $1102_1$-$1102_M$ are not limited to NMOS devices and can be implemented using any suitable switching device, including p-type metal oxide semiconductors (PMOS).

The switching devices $1102_1$-$1102_M$ may be clocked by the LO signals 1010 represented as M periodic non-overlapping clocks, $LO_0, LO_1, \ldots, LO_{M-1}$, with a duty-cycle of 1/M. Given that M represents the number of LO signals employed, that number of LO signals may be determined according to a number of harmonics present around a fundamental frequency (e.g., $\omega_{LO}$). The switching devices $1102_1$-$1102_M$ are switched ON and OFF at a rate substantially equal to the fundamental frequency of the LO signals 1010. The toggle rate of the switching devices $1102_1$-$1102_M$ effectively multiplies the RF signal input 1112, coupled to the sources of the switching devices $1102_1$-$1102_M$, by respective ones of the LO signals 1010. This effective multiplication results in frequency conversion of the RF signal input 1112 by the sum $(\omega_{RF}+\omega_{LO})$ and difference $(\omega_{RF}-\omega_{LO}$ or $\omega_{LO}-\omega_{RF})$ in frequency between the LO signals 1010 and the RF signal input 1112. The frequency-converted RF signals are each provided to the baseband impedances $1106_1$-$1106_M$ via the drains of the switching devices $1102_1$-$1102_M$.

According to some implementations, each of the TIAs $1106_1$-$1106_M$ includes a capacitor, a switched capacitor filter, a switch capacitor resistance, and/or a complex impedance. Note that the impedance of each of the TIAs $1106_1$-$1106_M$ may be the same or different. Further note that each of the TIAs $1106_1$-$1106_M$ may be adjusted to adjust the properties of the baseband amplification. While the switching devices $1102_1$-$1102_M$ are coupled to the baseband impedances $1106_1$-$1106_M$, the switching devices $1102_1$-$1102_M$ are connected to the RF signal input 1112 with a relatively large output impedance. In one or more implementations, the output impedance is 100 ohms ($\Omega$) or greater.

The TIAs $1106_1$-$1106_M$ can include capacitors and/or resistors that are respectively coupled between the drains of the switching devices $1102_1$-$1102_M$ and the output of the respective TIA. The input impedance of the TIAs $1106_1$-$1106_M$ are each substantially equivalent and their impedances around DC are given by (ignoring parasitics):

$$Z_{BB}=1/GM \quad (8)$$

where GM is the transconductance of the amplifier used in each of the TIAs $1106_1$-$1106_M$. However, as the frequency of the applied signal moves in either the positive or negative direction, away from DC (e.g., 0 MHz), the impedance $Z_{BB}$ decreases. Thus, the input impedance of the TIAs $1106_1$-$1106_M$ is effectively centered at baseband 1110 (e.g., 0 MHz).

The $\omega_{LO}$ can be adjusted to any frequency portion within a frequency band $\omega_A-\omega_B$. By adjusting $\omega_{LO}$ to have a frequency substantially equal to the center frequency of the desired channel, the translated baseband impedance 1108 can effectively provide a filter to attenuate frequency components of the RF signal outside the desired channel.

However, the RF signal input 1112 is frequency converted by the sum $(\omega_{RF}+(M-1)*\omega_{LO})$ and difference $(\omega_{RF}-(M-1)*\omega_{LO}$ or $(M-1)*\omega_{LO}-\omega_{RF})$ in frequency between the $(M-1)^{th}$ harmonic of the LO signals 1010 and the RF signal input 1112, where M is the number of LO phases employed. Therefore, the frequency components of the RF signal input 1112 at and around $(M-1)*\omega_{LO}$ and $(M+1)*\omega_{LO}$ will be frequency-translated to $\omega_{LO}$ and will fall within a pass-band of the translated baseband impedance 1108.

The overlap of these components at $\omega_{LO}$ can detrimentally affect the desired information or channel centered at $\omega_{LO}$. That is, the overlapping of these frequency components at $\omega_{LO}$ can prevent the desired information or channel centered at $\omega_{LO}$ from being recovered. Because these frequency components corresponding to LO harmonics may be within the frequency band $\omega_A-\omega_B$, they ideally receive little or no attenuation from components of the RF receiver. In other words, because these frequency components contain information that may be desired at any given point in time, these components ideally do not receive any significant attenuation from the components of the RF receiver front-end 104 (FIG. 1). Therefore, because of the relative strength of these components, the overlap of these components with the frequency components of the desired channel centered at $\omega_{LO}$ can prevent the desired information from being recovered.

Figure 12:
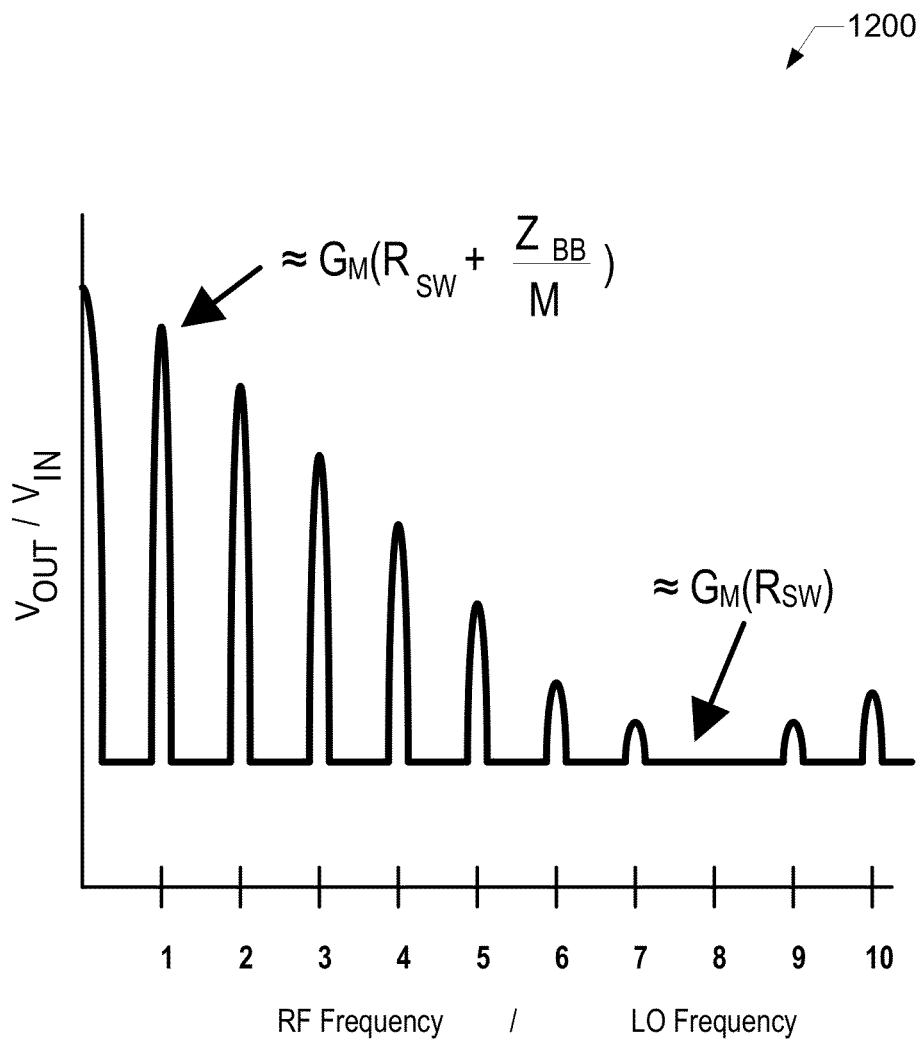
FIG. 12 illustrates a waveform diagram of a gain realized by the current-source downconversion path illustrated in FIG. 10 in accordance with one or more implementations.

FIG. 12 illustrates a waveform diagram 1200 of a gain realized in the current-source downconversion path 1000 illustrated in FIG. 10 in accordance with one or more implementations. The gain (e.g., $V_{OUT}/V_{IN}$) realized at the output of the transconductance cell 1002 (FIG. 10) provided in the current-source downconversion path 1000 can be defined as:

$$\approx G_M \left( R_{SW} + \frac{Z_{BB}}{M} \right) \quad (9)$$

where $G_M$ is the factor of proportionality between an input and output voltage, M represents the number of LO phases employed, $R_{SW}$ is the switch resistance of switching devices $1102_1$-$402_M$, and $Z_{BB}$ is the input impedance of the TIAs $1106_1$-$406_M$.

Illustrated in FIG. 12, a voltage gain can be realized for harmonics around the fundamental frequency, including unwanted signals (or blocker signals) at integer multiples of a wanted signal (e.g., first harmonic). The gain realized at the harmonics of unwanted blocker signals decreases as the frequency (e.g., RF frequency, LO frequency) increases. For example, the gain at the eighth harmonic is given by $G_M(R_{SW})$ since the baseband impedance for the eighth harmonic is substantially equivalent to zero.

Figure 13:
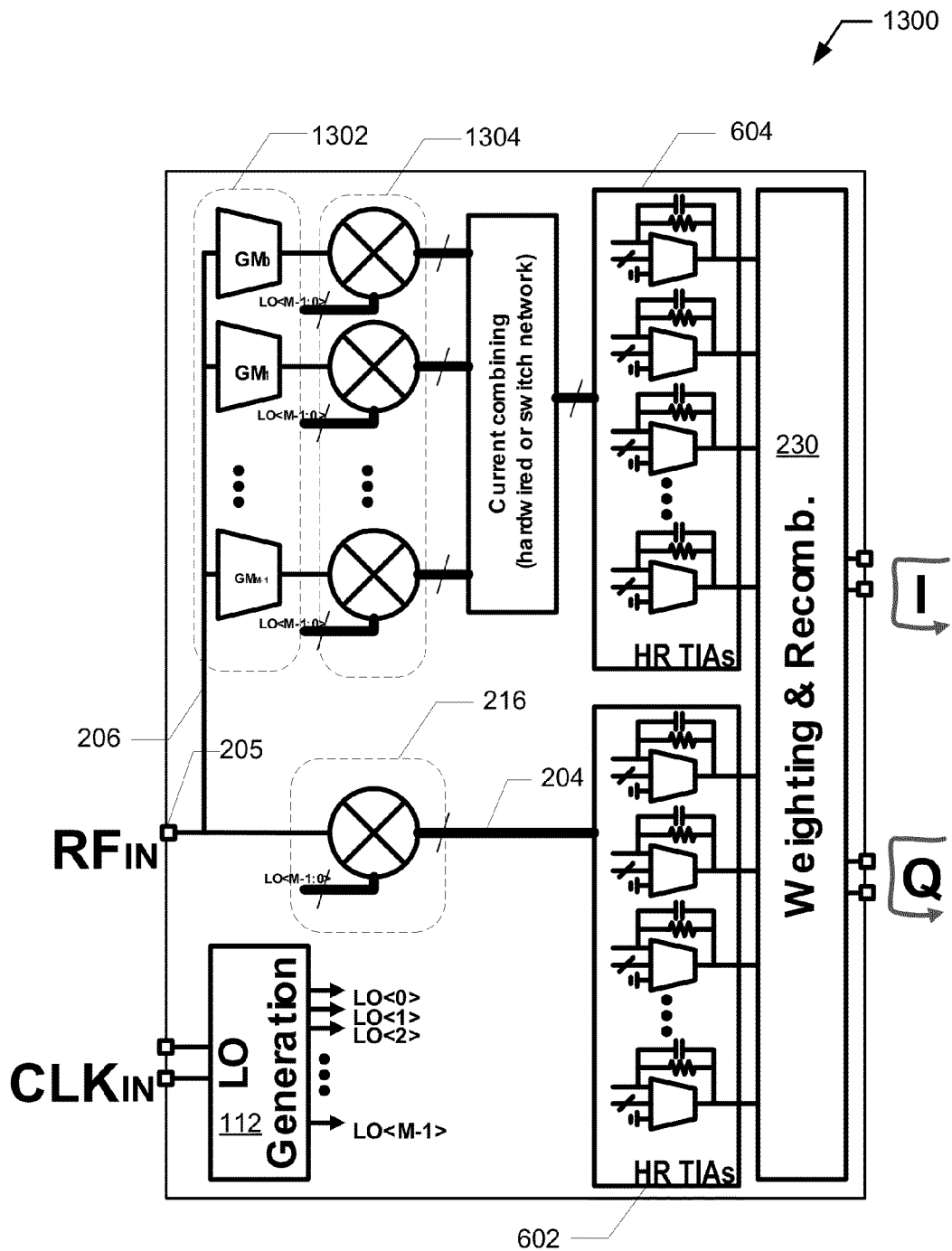
FIG. 13 illustrates a schematic diagram of a single-ended receiver front-end with enhanced harmonic rejection in accordance with one or more implementations.

FIG. 13 illustrates a schematic diagram of a single-ended receiver front-end 1300 with enhanced harmonic rejection in accordance with one or more implementations. The receiver front-end 1300 connects to the antenna 102 (FIG. 1), and includes two down-conversion paths 204 and 206 (FIG. 2), and a weighting and recombination module 230 (FIG. 2). The receiver front-end 1300 also includes transconductance cells $1302_1$-$1302_M$, passive mixers 216 and $1304_1$-$1304_M$, and transimpedance amplifiers 602 and 604. The passive mixers 216 and $1304_1$-$1304_M$ each include logic and/or circuitry that may provide for generation of inter-modulation products resulting from mixing an RF signal input 205 (FIG. 2) with LO signals generated by the LOGEN 112 (FIG. 1).

The receiver front-end 1300 has a similar structure as the receiver front-end 600 illustrated in FIG. 6 and operates in substantially the same manner. However, the receiver front-end 1300 provides the transconductance cells $1302_1$-$1302_M$ and passive mixers $1304_1$-$1304_M$ that collectively form an enhanced harmonic rejection circuitry. The transconductance cells $1302_1$-$1302_M$ are configured to feed to the passive mixers $1304_1$-$1304_M$. As such, the down-conversion path 206 can be defined as an oversampling downconversion path composed of multiple transconductance cells and multiple mixers to suppress replication of the wanted pass-band at harmonics of the LO frequency.

The noise figure of the receiver front-end 1300 can be realized as the following:

$$F = \left( 1 + \left( \frac{K\gamma}{G_M R_{SW}} \right) \right) \left| \frac{1}{CG_{MIX}} \right|^2 \quad (10)$$

where K is a constant dependent on a given implementation, $\gamma$ is a constant related to the noise of a given technology, $R_{SW}$ is the switch resistance of the passive mixers 206, and $CG_{MIX}$ is the conversion gain of the passive mixers 206 used in the receiver front-end 1300. This is an idealized and simplified analysis; an actual circuit implementation may differ significantly. According to some implementations, the receiver front-end 1300 and the above-described elements are varied and are not limited to the functions, structures, configurations, implementations or examples provided.

According to some implementations, a receiver for wideband applications includes an integrated circuit pin configured to couple a radio frequency (RF) signal to a first signal path and a second signal path. The receiver includes multiple transconductance cells configured to produce weighted current signals proportional to the RF signal along the first signal path and the second signal path. Each of the transconductance cells are configured to provide an effective transconductance of a first magnitude for frequency components of the RF signal arising from a first harmonic and an effective transconductance of a second magnitude less than the first magnitude for frequency components of the RF signal arising from harmonics at integer multiples of the first harmonic. The receiver also includes multiple mixers configured to mix the weighted current signals with local oscillator (LO) signals of successive phase shifts to generate mixer signals. The receiver also includes a feedback impedance coupled to at least a portion of the transconductance cells along the first signal path to convert the mixer signals into corresponding voltage signals.

In one or more implementations, the receiver has each of the transconductance cells further configured with a transconductance gain that shifts the weighted current signal with a defined phase such that a constructive sum of the weighted current signals provides a resulting current signal of a selected phase. The receiver has the mixers and the transconductance cells employ single-ended inputs. As such, the transconductance gain is shifted to reject any integer multiple of a wanted signal corresponding to the first harmonic. The receiver also has the mixers and the transconductance cells employ differential inputs. As such, the transconductance gain is shifted to reject odd integer multiples of a wanted signal corresponding to the first harmonic. The receiver has the transconductance cells along the second signal path receive a voltage input equivalent to equation (6), shown above, where m determines the effective transconductance of the transconductance cell, and M represents the number of LO phases employed. The receiver also includes multiple transimpedance amplifiers along the second signal path, in which each of the transimpedance amplifiers has at least a portion of the transconductance cells. The receiver has each of the transconductance cells configured with a transconductance weighting that causes the effective transconductance of the transconductance cell to be non-zero when excited by received signals arising from a harmonic within a frequency band of interest but zero for received signals arising from harmonics outside the frequency band of interest.

Figure 14:
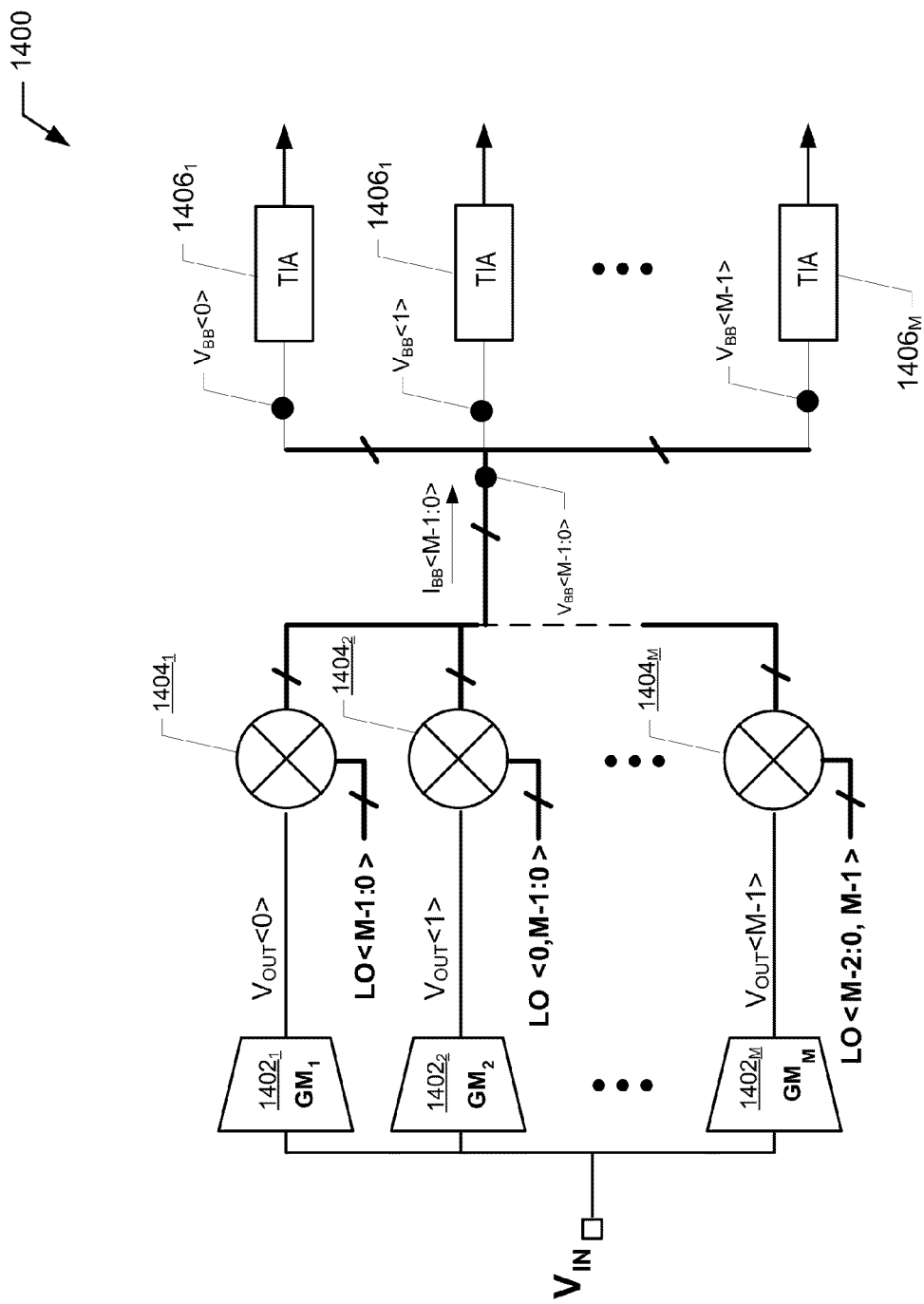
FIG. 14 illustrates a conceptual diagram of a single-ended current-source downconversion path provided in the receiver front-end illustrated in FIG. 13 in accordance with one or more implementations.

FIG. 14 illustrates a schematic diagram of a single-ended current-source downconversion path 1400 provided in the receiver front-end 1300 illustrated in FIG. 13 in accordance with one or more implementations. A conventional passive-mixer-based downconversion path provides voltage amplification of the wanted signal around the LO fundamental as well as unwanted signals around harmonics of the LO frequency. The current-source downconversion path 1400 overcomes this previous limitation and provides a practical implementation for eliminating unwanted RF amplification.

The current-source downconversion path 1400 performs a filtering technique that eliminates multiple harmonics at RF by placing multiple stages of oversampling passive mixers at a node within the receiver front-end 200 (FIG. 2). The current-source downconversion path 1400 also employs multiple transconductance cells (e.g., 1402$_1$-1402$_M$) coupled to respective frequency conversion cells 1404$_1$-1404$_M$ (or passive mixers) to directly receive the inbound RF voltage signal (e.g., V$_{IN}$) for conversion to a current signal before mixing (or multiplying) the current signal with multiple phased LO signals (e.g., LO<M−1:0>). In this regard, each of the mixed RF signals is phase-shifted according to the respective LO signal, which may include an unwanted blocker signal at frequency f$_b$, and a wanted signal at frequency f$_w$, which may be Δf$_b$ lower than f$_b$, e.g., f$_w$=f$_b$−Δf$_b$. Although the bandwidth around these LO harmonics is very small, blocker signals located at these specific harmonic frequencies potentially saturate the receiver. Although the transconductance cells are voltage-to-current converters, the outputs of the transconductance cells can realize a voltage (e.g., V$_{OUT}$) using impedances as seen at inputs of the frequency conversion mixers. Therefore, the subject technology proposes weighting each transconductance cell such that the RF current signal corresponding to LO harmonics is knocked out and the resulting RF current signal passes to transimpedance amplifiers (TIAs) 1406$_1$-1406$_M$ to produce a voltage gain (e.g., $$\left(e.g., \frac{V_{OUT}}{V_{IN}}\right)$$

around the wanted signal. According to some implementations, the TIAs 1406$_1$-1406$_M$ may be configured to reject unwanted harmonics in accordance with the baseband harmonic rejection technique discussed with respect to FIG. 7.

The current-source downconversion path 1400 includes M transconductance cells 1402$_1$-1402$_M$ configured to convert an input RF voltage signal at V$_{IN}$ into multiple RF current signals. In one or more implementations, each of the transconductance cells 1402$_1$-1402$_M$ is configured with a transconductance gain relative to one another. That is, each of the multiple transconductance cells has a transconductance weighting equivalent to equation (6), where X is an integer that represents each of the transconductance cells (e.g., 1402$_1$-1402$_M$), M is a number of LO phases employed, and k is an arbitrary constant that determines the effective transconductance of the transconductance cell.

The current-source downconversion path 1400 also includes multiple frequency conversion cells 1404$_1$-1404$_M$. Each of the frequency conversion cells 1404$_1$-1404$_M$ is configured to receive multiple non-overlapping local oscillator (LO) signals (e.g., LO<M−1:0>). The multiple non-overlapping LO signals have successive phase shifts substantially equal to 360/M degrees. The multiple non-overlapping LO signals each have a fundamental frequency equivalent to ω$_{LO}$. M may be determined based on a number of harmonics around the fundamental frequency.

Each of the frequency conversion cells 1404$_1$-1404$_M$ is further configured to mix a respective RF current signal with all LO signals to produce multiple downconverted current signals. Given that the transconductance weighting produces weighted current signals, the downconverted current signals corresponding to harmonic multiples of the wanted signal (i.e. unwanted harmonic blockers) are not passed to the TIAs 1406$_1$-1406$_M$. This is because the weighting causes the effective transconductance to be substantially large for harmonics corresponding to the wanted signal and zero for harmonics corresponding to the unwanted signals.

The TIAs 1406$_1$-1406$_M$ are coupled to the multiple frequency conversion cells and ground and are configured to provide a baseband signal (e.g., in-phase and/or quadrature components of the input RF voltage signal) when frequency translated by the frequency conversion cells 1404$_1$-1404$_M$. In one or more implementations, the number of TIAs 1406$_1$-1406$_M$ is the same and/or different from the number of transconductance cells 1402$_1$-1402$_M$ and frequency conversion cells 1404$_1$-1404$_M$ provided within the current-source downconversion path 1400.

A translated baseband impedance at an input to the transconductance cells 1402$_1$-1402$_M$ is equivalent to the input impedance of the TIAs 1404$_1$-1404$_M$ translated in frequency by ω$_{LO}$. In addition, the input impedance of the TIAs 1404$_1$-1404$_M$ is translated as seen by the input RF voltage signal at an input to the transconductance cells 1402$_1$-1402$_M$.

In some implementations, a wideband receiver includes an integrated circuit pin that is configured to couple an RF signal to an RF signal path. The receiver also may include an oversampling passive mixer coupled to the RF signal path and configured to translate a baseband impedance to a higher frequency. The wideband receiver includes multiple transconductance cells each having an effective transconductance of a first magnitude for frequency components of the RF signal within a frequency band of interest and an effective transconductance of a second magnitude that is lesser than the first magnitude for frequency components of the RF signal outside the frequency band of interest.

The receiver also may include multiple frequency conversion cells configured to receive a multiple non-overlapping local oscillator (LO) signals. Each of the multiple frequency conversion cells may be further configured to mix one of the multiple RF current signals with the multiple non-overlapping LO signals. The receiver also may include multiple baseband impedances coupled to the multiple frequency conversion cells and ground.

Each of the multiple transconductance cells is configured with a transconductance weighting that causes the effective transconductance of the transconductance cell to be large when excited by RF signals arising from a harmonic within the frequency band of interest but zero for RF signals arising from harmonics outside the frequency band of interest. The transconductance weighting provides that only wanted harmonics excite a current from the transconductance cell. The transconductance cells are configured to amplify an RF signal from any harmonic of a fundamental frequency. The transconductance cells are further configured to amplify an RF signal from more than one harmonic multiple of the fundamental frequency.

Referring to FIG. 14, the frequency conversion cells 1404$_1$-1404$_M$ include metal-oxide semiconductor field effect transistors (MOSFETs) (not shown). Specifically, the frequency conversion cells 1404$_1$-1404$_M$ are n-channel MOSFETs (NMOS). However, the frequency conversion cells 1404$_1$-1404$_M$ can be implemented using any suitable frequency conversion device, including p-channel MOSFETs (PMOS), bipolar junction transistors (BJTs) and junction gate field effect transistors (JFETs). The MOSFETs provided in the frequency conversion cells 1404$_1$-1404$_M$ are operated substantially in their linear mode when powered ON.

According to some implementations, the current-source downconversion path 1400 is integrated in CMOS IC technology (or others, e.g., Bipolar, BiCMOS, and SiGe) and applied in wireless receiver systems including GSM, WCDMA, Bluetooth, and wireless LANs (e.g., IEEE 1402.11).

In one or more implementations, a differential oversampling passive mixer can be designed for use in wideband RF receivers (e.g. UWB and TV receivers). The differential oversampling passive mixer may be configured to receive a differential RF signal input (e.g., $RF_{IN+}$ and $RF_{IN-}$) at a differential input pair via a current source (e.g., a transconductance cell). The differential oversampling passive mixer may include a passive mixer and a baseband amplifier. The baseband amplifier may include multiple transimpedance amplifiers and multiple capacitors. The passive mixer may be configured to translate the baseband impedance (e.g., input impedance to the baseband amplifier) to a higher frequency. Specifically, the passive mixer is configured to translate the baseband impedance to a higher frequency substantially equal to the fundamental frequency of LO signals received by the passive mixer.

Figure 15:
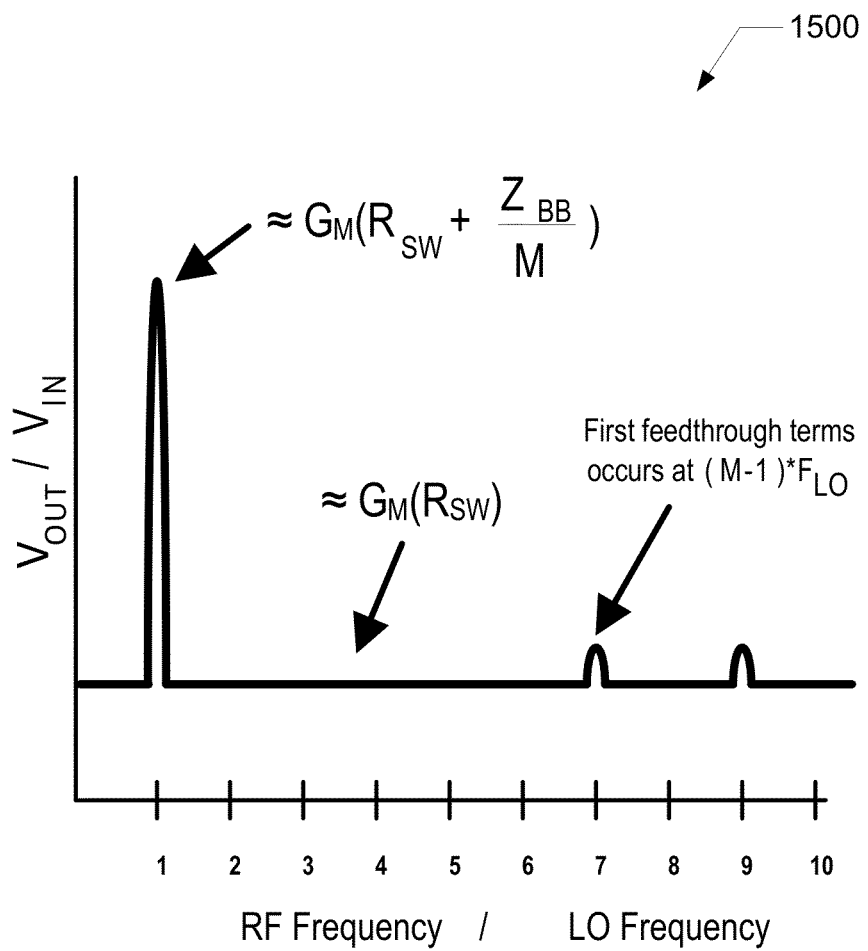
FIG. 15 illustrates a waveform diagram of a gain realized by the current-source downconversion path illustrated in FIG. 14 in accordance with one or more implementations.

FIG. 15 illustrates a waveform diagram 1500 of a conversion gain from the RF input to the output of a single TIA realized in the current-source downconversion path 1400 illustrated in FIG. 14 in accordance with one or more implementations. The x-axis is RF frequency normalized to the LO frequency. Note that signals originating from around LO harmonics up to (M−1)th harmonics are not amplified and, so, cannot saturate the receiver. By appropriately weighting the transconductance cells 1402$_1$-1402$_M$, the transconductance weighting causes the RF current signals to shift in phase. Thus, the RF current signals, before reaching the transimpedance amplifiers 1406$_1$-1406$_M$, constructively sum to produce a resulting current signal that corresponds to downconverted signals from around the LO frequency (e.g., the wanted signal). In this regard, the phase-shifted current signals with opposing phases in effect cancel one another at the baseband impedance input. Therefore, no voltage gain can be realized for the canceled-out current signals (or unwanted signals). In some implementations, the input to the transimpedance amplifiers 1406$_1$-1406$_M$ defines a pass-band around the wanted signal and minimal gain around the $7^{th}$ and $9^{th}$ LO harmonics (assuming M=8). That is, the first feed-through terms may occur at $(M-1)*\omega_{LO}$.

Given that there is no amplification of harmonic blockers at the output of the current-source downconversion path 1400 with the enhanced harmonic rejection circuit, no harmonic blockers up to the $(M-1)^{th}$ harmonic can saturate the receiver.

Figure 16:
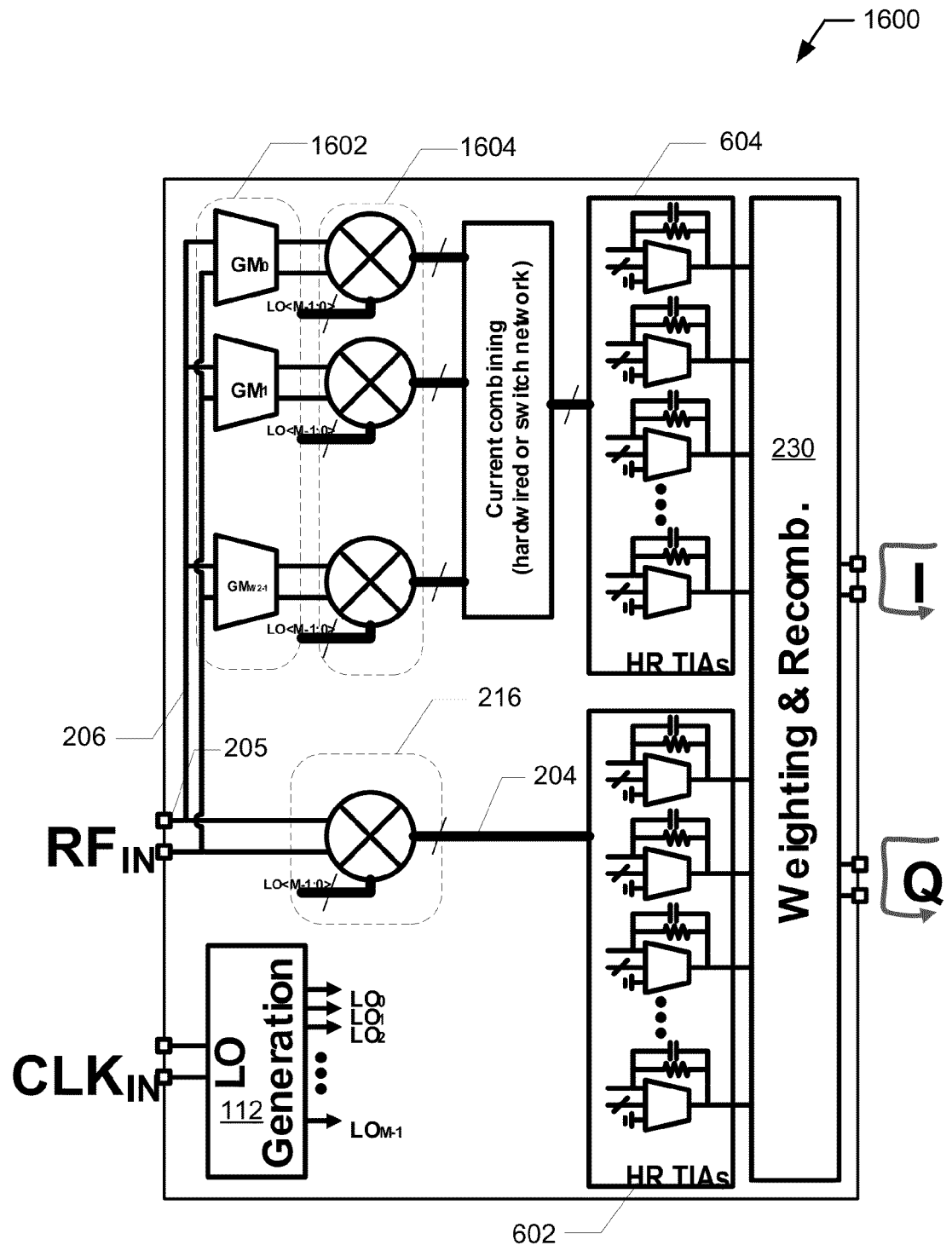
FIG. 16 illustrates a schematic diagram of a differential receiver front-end with enhanced harmonic rejection in accordance with one or more implementations.

FIG. 16 illustrates a schematic diagram of a differential receiver front-end 1600 with enhanced harmonic rejection in accordance with one or more implementations. The receiver front-end 1600 connects to the antenna 102 (FIG. 1), and includes two down-conversion paths 204 and 206 (FIG. 2), and a weighting and recombination module 230 (FIG. 2). The receiver front-end 1600 also includes transconductance cells 1602$_1$-1602$_M$, passive mixers 216 and 1604$_1$-1604$_M$, and transimpedance amplifiers 602 and 604. The passive mixers 216 and 1604$_1$-1604$_M$ each include logic and/or circuitry that may provide for generation of inter-modulation products resulting from mixing a differential RF signal input 205 (FIG. 2) with LO signals generated by the LOGEN 112 (FIG. 1).

The receiver front-end 1600 has a similar structure as the receiver front-end 1300 illustrated in FIG. 6 and operates in substantially the same manner. However, the receiver front-end 1600 provides the transconductance cells 1602$_1$-1602$_M$ and passive mixers 1604$_1$-1604$_M$ having differential inputs. Similarly to FIG. 13, the transconductance cells 1602$_1$-1602$_M$ are configured to feed to the passive mixers 1604$_1$-1604$_M$. As such, the down-conversion path 206 can be defined as a differential oversampling passive mixer composed of differential transconductance cells and differential mixers to suppress replication of the wanted pass-band at harmonics of the LO frequency. The weightings of the transconductance cells 1602$_1$-1602$_M$ in this case are given by (7) as opposed to (6).

Figure 17:
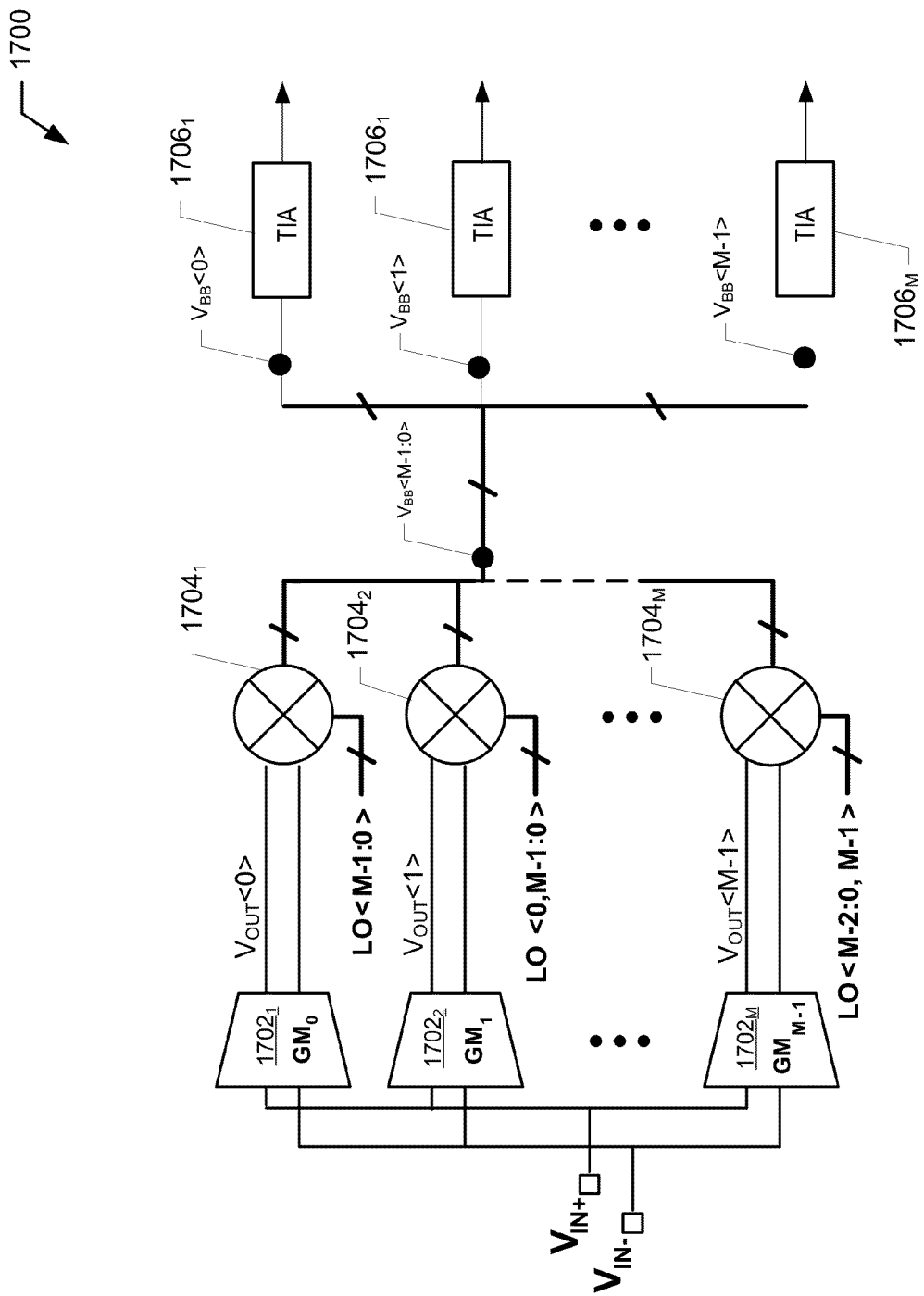
FIG. 17 illustrates a schematic diagram of a differential current-source downconversion path provided in the receiver front-end illustrated in FIG. 16 in accordance with one or more implementations.

FIG. 17 illustrates a schematic diagram of a differential current-source downconversion path 1700 provided in the receiver front-end 1600 illustrated in FIG. 16 in accordance with one or more implementations. The differential current-source downconversion path 1700 processes a differential RF signal (e.g., $RF_{IN+}$ and $RF_{IN-}$) received at a differential input pair (e.g., node $V_{IN}$). The differential current-source downconversion path 1700 includes an oversampling passive mixer composed of passive mixers 1704$_1$-1704$_M$ and transimpedance amplifiers (TIAs) 1706$_1$-1706$_M$.

The differential current-source downconversion path 1700 also employs multiple transconductance cells (e.g., 1702$_1$-1702$_M$) to directly receive the inbound differential RF voltage signal (e.g., $V_{IN}$) for conversion to a differential current signal before mixing (or multiplying) the current signal with multiple phased LO signals (e.g., LO<M-1:0>). The current-source downconversion path 1700 includes M transconductance cells 1702$_1$-1702$_M$ configured to convert the input differential RF voltage signal at $V_{IN}$ into multiple RF current signals.

In one or more implementations, each of the transconductance cells 1702$_1$-1702$_M$ is configured with a transconductance gain relative to one another. That is, each of the transconductance cells 1702$_1$-1702$_M$ produces a transconductance gain. By appropriately weighting the transconductance cells 1702$_1$-1702$_M$, the weighting causes the RF current signals to shift in phase. Thus, the RF current signals, before reaching the TIAs 1706$_1$-1706$_M$, constructively sum to produce a resulting current signal that corresponds to downconverted signals from around the LO frequency (i.e. the wanted signal). In this regard, the phase-shifted current signals with opposing phases in effect cancel one another at the baseband impedance input.

Figure 18:
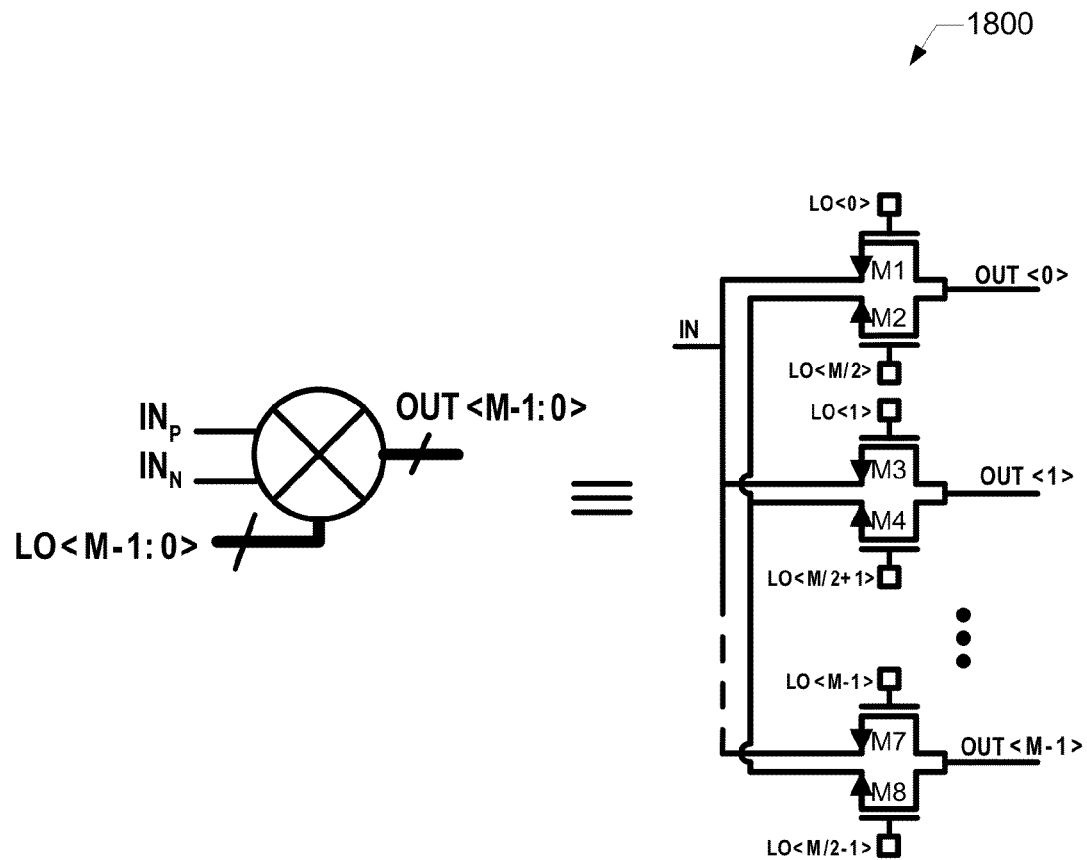
FIG. 18 illustrates a schematic diagram of a differential passive mixer provided in the current-source downconversion path illustrated in FIG. 17 in accordance with one or more implementations.

FIG. 18 illustrates a schematic diagram of a differential oversampling passive mixer 1800 provided in the current-source downconversion path 1700 illustrated in FIG. 17 in accordance with one or more implementations. According to some implementations, the differential oversampling passive mixer 1800 includes switching devices M1-M8, where M is equal to 8. The variable M can be defined as any positive integer. The switching devices M1-M8 are metal-oxide semiconductor field effect transistors (MOSFETs). Specifically, the switching devices M1-M8 are n-channel MOSFETs (NMOS). However, as will be appreciated by one of ordinary skill in the art, the switching devices M1-M8 can be implemented using any suitable switching device, including p-channel MOSFETs (PMOS), bipolar junction transistors (BJTs) and junction gate field effect transistors (JFETs). The switching devices M1-M8 may be operated substantially in their linear mode when ON.

In operation, the first switching device, M1, of the passive mixers 1704$_1$-1704$_M$ (FIG. 17) receives a differential LO signal (LO<0>). The LO signal has a frequency of $\omega_{LO}$ and a duty-cycle substantially equal to 12.5%. The gates of switching devices M1, M3 up to M−1 are coupled to the positive LO signal (LO$_+$), and the gates of switching devices M2, M4 up to $$\left(\frac{M}{2} - 1\right)$$

are coupled to the negative LO signal (LO_). Because the two LO signals (LO_+ and LO_) are substantially 180-degrees out of phase, the switching device pair M1 and M2 are switched ON and OFF at non-overlapping intervals at the frequency of the LO signal ($\omega_{LO}$). The non-overlapping switching at a frequency of $\omega_{LO}$ effectively multiplies the positive RF signal (RF$_{IN+}$), coupled to the source of switching device M1, and the negative RF signal (RF$_{IN-}$), coupled to the source of switching device M2, by ±1. This effective multiplication results in frequency conversion of the differential RF signal by the sum ($\omega_{RF}+\omega_{LO}$) and difference ($\omega_{RF}-\omega_{LO}$ or $\omega_{LO}-\omega_{RF}$) in frequency between the LO signal (LO<0>) and the differential RF signal. The frequency-converted component of the RF signal is provided differentially to the TIAs $1706_1$-$1706_M$ (FIG. 17). As noted above, the TIAs $1706_1$-$1706_M$ may include capacitors having impedances that are given by (ignoring parasitics) equation (9).

It follows that the frequency conversion of the differential RF signal by the passive mixers $1704_1$-$1704_M$ alters the baseband impedance seen by the differential RF signal at the differential input pair. Specifically, the impedance of the capacitors will each appear translated by ±$\omega_{LO}$ as seen by the differential RF signal at the differential input pair, thus becoming a current-source downconversion path presented at the differential input pair.

One or more implementations are performed by one or more integrated circuits, such as application specific integrated circuits (ASICs) or field programmable gate arrays (FPGAs). In one or more implementations, such integrated circuits execute instructions that are stored on the circuit itself Those of skill in the art would appreciate that the various illustrative blocks, elements, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "receiver", "amplifier", "transconductance cell," and "mixer" all refer to electronic or other technological devices. These terms exclude people or groups of people.

The predicate words "configured to" and "operable to" do not imply any particular tangible or intangible modification of a subject, but, rather, are intended to be used interchangeably. In one or more implementations, a receiver configured to receive and process an operation or a component may also mean the receiver being operable to receive and process the operation.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "implementation" does not imply that such implementation is essential to the subject technology or that such implementation applies to all configurations of the subject technology. A disclosure relating to an implementation may apply to all implementations, or one or more implementations. An implementation may provide one or more examples of the disclosure. A phrase such an "implementation" may refer to one or more implementations and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A radio frequency (RF) receiver comprising:
a first set of transconductance cells configured to produce respective weighted current signals proportional to an input voltage signal;
a plurality of frequency conversion cells coupled to the first set of transconductance cells and configured to mix the weighted current signals with a plurality of non-overlapping local oscillator (LO) signals to produce downconverted current signals; and
a plurality of transimpedance amplifiers coupled to the plurality of frequency conversion cells and configured to produce output voltage signals proportional to the downconverted current signals, wherein the plurality of transimpedance amplifiers comprise a second set of transconductance cells, each input to the plurality of transimpedance amplifiers being coupled to each output of the plurality of frequency conversion cells,
wherein each of the first set and second set of transconductance cells has an effective transconductance of a first magnitude for frequency components of the input voltage signal arising from a first harmonic and an effective transconductance of a second magnitude less than the first magnitude for frequency components of the input voltage signal arising from harmonics at integer multiples of the first harmonic.

2. The RF receiver of claim 1, wherein each of the first and second sets of transconductance cells is configured with a transconductance weighting that causes the effective transconductance of the transconductance cell to be non-zero when excited by received signals arising from a harmonic within a frequency band of interest and zero for received signals arising from harmonics outside the frequency band of interest.

3. The RF receiver of claim 2, wherein the transconductance weighting provides that wanted harmonics cause a current change through the transconductance cell.

4. The RF receiver of claim 1, wherein the first and second sets of transconductance cells are configured to amplify a received signal from any harmonic of a fundamental frequency.

5. The RF receiver of claim 4, wherein the first and second sets of transconductance cells are further configured to amplify a received signal from more than one harmonic multiple of the fundamental frequency.

6. The RF receiver of claim 1, wherein the plurality of frequency conversion cells and the first set of transconductance cells employ single-ended inputs.

7. The RF receiver of claim 6, wherein each of the first and second sets of transconductance cells comprises a set of transconductance weighting equal to $$gmx = k\left[1 + \cos\left(\frac{2\pi X}{M}\right)\right],$$

where X is an integer that represents each of the transconductance cells, M is a number of LO phases employed, and k is an arbitrary constant that determines the effective transconductance of the transconductance cell.

8. The RF receiver of claim 1, wherein the plurality of frequency conversion cells and the first set of transconductance cells employ differential inputs.

9. The RF receiver of claim 8, wherein each of the first and second sets of transconductance cells comprises a set of transconductance weighting equal to $$gmx = k\left[\cos\left(\frac{2\pi X}{M}\right)\right],$$

where X is an integer that represents each of the transconductance cells, M is a number of LO phases employed, and k is an arbitrary constant that determines the effective transconductance of the transconductance cell.

10. The RF receiver of claim 1, wherein the plurality of non-overlapping LO signals have successive phase shifts substantially equal to 360/M degrees, where M is a number of LO phases employed.

11. The RF receiver of claim 10, wherein the plurality of non-overlapping LO signals each have a fundamental frequency.

12. The RF receiver of claim 11, wherein the number of LO phases corresponds to a number of harmonics relative to the fundamental frequency.

13. The RF receiver of claim 12, wherein each of the second set of transconductance cells receives M downconversion signals including an input coupled to ground, where M is the number of LO phases employed based on the number of harmonics corresponding to the fundamental frequency with a magnitude greater than a threshold magnitude.

14. The RF receiver of claim 1, wherein each of the second set of transconductance cells receives a voltage input equivalent to $$V_{IN} L \frac{m*(M-1)}{M},$$

where m is a LO harmonic from around which the input voltage signal originated, and M represents a number of LO phases employed.

15. A receiver for wideband applications, comprising:
an integrated circuit pin configured to couple a radio frequency (RF) signal to a first signal path and a second signal path;
a plurality of transconductance cells configured to produce weighted current signals proportional to the RF signal along the first signal path and the second signal path, wherein each of the plurality of transconductance cells has an effective transconductance of a first magnitude for frequency components of the RF signal arising from a first harmonic and an effective transconductance of a second magnitude less than the first magnitude for frequency components of the RF signal arising from harmonics at integer multiples of the first harmonic;
a plurality of mixers configured to mix the weighted current signals with local oscillator (LO) signals of successive phase shifts to generate mixer signals; and
a feedback impedance coupled to at least a portion of the plurality of transconductance cells along the first signal path to convert the mixer signals into corresponding voltage signals, each input to the at least a portion of the plurality of transconductance cells being coupled to each output of the plurality of mixers.

16. The receiver of claim 15, wherein each of the plurality of transconductance cells is further configured with a transconductance gain that shifts the weighted current signal with a defined phase such that a constructive sum of the weighted current signals provides a resulting current signal of a selected phase.

17. The receiver of claim 16, wherein the plurality of mixers and the plurality of transconductance cells employ single-ended inputs, and wherein the transconductance gain is shifted to reject any integer multiple of a wanted signal corresponding to the first harmonic.

18. The receiver of claim 16, wherein the plurality of mixers and the plurality of transconductance cells employ differential inputs, and wherein the transconductance gain is shifted to reject odd integer multiples of a wanted signal corresponding to the first harmonic.

19. The receiver of claim 15, wherein each of the plurality of transconductance cells alone the second signal path receives an input voltage signal equivalent to $$V_{IN L} \frac{m*(M-1)}{M},$$

where m is a LO harmonic from around which the input voltage signal originated, and M represents a number of LO phases employed.

20. The receiver of claim 15, further comprising a plurality of transimpedance amplifiers along the second signal path, wherein each of the plurality of transimpedance amplifiers comprises at least a portion of the plurality of transconductance cells.

* * * * *